US009655237B2

(12) United States Patent
Kaga

(10) Patent No.: US 9,655,237 B2
(45) Date of Patent: May 16, 2017

(54) SILICON NITRIDE SUBSTRATE AND METHOD FOR PRODUCING SILICON NITRIDE SUBSTRATE

(71) Applicant: HITACHI METALS, LTD., Tokyo (JP)

(72) Inventor: Youichirou Kaga, Kitakyushi (JP)

(73) Assignee: HITACHI METALS, LTD., Tokyo (JP)

( * ) Notice: Subject to any disclaimer, the term of this patent is extended or adjusted under 35 U.S.C. 154(b) by 453 days.

(21) Appl. No.: 14/241,789

(22) PCT Filed: Oct. 11, 2012

(86) PCT No.: PCT/JP2012/076339
§ 371 (c)(1),
(2) Date: Feb. 27, 2014

(87) PCT Pub. No.: WO2013/054852
PCT Pub. Date: Apr. 18, 2013

(65) Prior Publication Data
US 2014/0220302 A1    Aug. 7, 2014

(30) Foreign Application Priority Data
Oct. 11, 2011    (JP) .................................. 2011-224020

(51) Int. Cl.
*H05K 1/03*    (2006.01)
*C04B 35/64*    (2006.01)
(Continued)

(52) U.S. Cl.
CPC ........... *H05K 1/0306* (2013.01); *B32B 18/00* (2013.01); *C04B 35/583* (2013.01);
(Continued)

(58) Field of Classification Search
None
See application file for complete search history.

(56) References Cited

U.S. PATENT DOCUMENTS

2008/0277841 A1    11/2008    Natsuhara et al.
2011/0272187 A1    11/2011    Kaga et al.
2012/0119349 A1    5/2012    Naba

FOREIGN PATENT DOCUMENTS

JP    A-63-190765    8/1988
JP    B2-3369819    1/2003
(Continued)

OTHER PUBLICATIONS

International Search Report issued in International Application No. PCT/JP2012/076339 on Nov. 20, 2012 (with translation).
(Continued)

*Primary Examiner* — Alexandre Ferre
(74) *Attorney, Agent, or Firm* — Oliff PLC

(57) ABSTRACT

A silicon nitride substrate including a phase encompassed of silicon nitride particles, and intergranular phase formed from a sintering aid, wherein a separation layer is formed on the surface of a molded body including silicon nitride powder, sintering aid powder, and organic binder, by using a boron nitride paste containing boron nitride powder, organic binder, and organic solvent; the separation layer and molded body are heated; the organic binder is removed from the separation layer and molded body; subsequently molded bodies stacked with a separation layer therebetween, are sintered. Boron nitride paste contains 0.01 to 0.50% by oxygen mass and 0.001 to 0.5% by carbon mass, and c/a is within range of 0.02 to 10.00, where c is oxygen content in the powder of the boron nitride paste, and a carbon content in the degreased separation layer, which includes 0.2 to 3.5 mg/cm$^2$ of hexagonal boron nitride powder.

9 Claims, 4 Drawing Sheets

(51) Int. Cl.
*H01L 23/15* (2006.01)
*B32B 18/00* (2006.01)
*C04B 35/583* (2006.01)
*C04B 35/587* (2006.01)
*C04B 37/02* (2006.01)

(52) U.S. Cl.
CPC ............ *C04B 35/587* (2013.01); *C04B 35/64* (2013.01); *C04B 37/026* (2013.01); *H01L 23/15* (2013.01); *C04B 2235/3206* (2013.01); *C04B 2235/3225* (2013.01); *C04B 2235/5436* (2013.01); *C04B 2235/6025* (2013.01); *C04B 2235/72* (2013.01); *C04B 2235/721* (2013.01); *C04B 2235/767* (2013.01); *C04B 2235/786* (2013.01); *C04B 2235/788* (2013.01); *C04B 2235/85* (2013.01); *C04B 2235/963* (2013.01); *C04B 2237/125* (2013.01); *C04B 2237/127* (2013.01); *C04B 2237/361* (2013.01); *C04B 2237/368* (2013.01); *C04B 2237/407* (2013.01); *C04B 2237/706* (2013.01); *C04B 2237/708* (2013.01); *H01L 2924/0002* (2013.01); *H05K 2201/0175* (2013.01); *H05K 2203/1126* (2013.01); *H05K 2203/1131* (2013.01); *Y10T 428/24421* (2015.01)

(56) References Cited

FOREIGN PATENT DOCUMENTS

| | | |
|---|---|---|
| JP | A-2010-208898 | 9/2010 |
| JP | A-2011-178598 | 9/2011 |
| WO | 2010/082478 A1 | 7/2010 |
| WO | 2011/010597 A1 | 1/2011 |

OTHER PUBLICATIONS

Jul. 16, 2015 extended Search Report issued in European Patent Application No. 12840162.7.

(a)

(b)

(a)

(b)

(c)

SILICON NITRIDE SUBSTRATE AND METHOD FOR PRODUCING SILICON NITRIDE SUBSTRATE

TECHNICAL FIELD

The present invention relates to a silicon nitride substrate and a method for producing a silicon nitride substrate.

BACKGROUND ART

Recently, a ceramic substrate which is a ceramic sintered body has been widely used as an isolated substrate comprising a circuit board. In case of a circuit board to be used for, for example, a semiconductor module provided with a semiconductor element having large electric power and large heating value, a high degree of mechanical strength, thermal conductivity, and electric isolation are required, and thus, ceramic substrates made of sintered bodies of aluminum nitride, silicon nitride, etc., are widely used.

Here, a circuit board comprises a ceramic substrate provided its one side of with a metal substrate functioning as a circuit plate on which a semiconductor is mounted, and provided on its other side with a metal substrate functioning as a heat sink connected to a radiation member, and the like. Usually, the ceramic substrate and the metal substrates are attached by a direct bonding method (DBC) or an active metal bonding method (AMB). In both bonding methods, if an excessively large waving is present on the surface of the ceramic substrate, voids are generated at the bonding boundary between the ceramic substrate and the metal substrate, the strength is lowered at the bonding boundary, and other bonding qualities are decreased. Therefore, the mechanical performance, the thermal performance, and the electrical performance of the circuit board are decreased. Then, in order to obtain a long-life circuit board having a superior property, decreasing the surface waviness of the ceramic substrate has been desired. Particularly, in recent years, the thickness of the ceramic substrate tends to be thinner to the thickness of 1.0 mm or lower in order to lower the thermal resistance of the entire circuit board, and in such a thin ceramic substrate, waving is easily generated on the surface due to deformation at the time of sintering. Therefore, there has been an increasing demand for the decrease of surface waviness.

Examples of the technology answering such a demand are disclosed in the following Patent Documents 1 and 2. Namely, Patent Document 1 discloses "a method for producing a ceramic sintered body comprising: molding a ceramic green sheet; coating a release agent containing BN powder on the surface of the green sheet by a roll coater to have 0.3 to 3 mg/cm² of BN powder, the BN powder having an oxygen content of 3% by weight or less and an average particle diameter of 20 µm or less; laminating a plurality of green sheets; degreasing; pressing the upper and lower surfaces of the stack by setters made of BN and storing the stack in the closed container made of the same material as the setter; and sintering", and discloses a plate-like aluminum nitride sintered body produced by this method and having a flatness of 100 µm or lower.

Further, Patent Document 2 filed in the name of the present applicant discloses "a method for producing a silicon nitride substrate comprising, laminating a plurality of green sheets with a separation material between each of the green sheets, subjecting the stack to sintering, separating the sintered stack to obtain a plurality of silicon nitride sintered bodies, and obtaining silicon nitride substrates from the silicon nitride sintered bodies, wherein the separation material is boron nitride (BN) powder having an oxygen content of 0.01 to 0.5% by weight, an average particle diameter of 4 to 20 µm, a specific surface area of 20 m²/g or less, and the BN powder is coated on the green sheet surface in a coating amount of 0.05 to 1.4 mg/cm²", and discloses "a silicon nitride substrate mainly comprised of $Si_3N_4$, wherein a coefficient of variation Cv showing the distribution of the amount of B derived from the BN remaining on the surface of the silicon nitride substrate is 1.0 or lower, waviness Wa of the silicon nitride substrate surface is 1.5 µm or lower (with the proviso that the waviness is obtained by measuring a filtered centerline waviness using a surface roughness meter, and calculating an arithmetic average waviness Wa thereof, namely, an arithmetic average of absolute values of the deviation from the average surface height value, under the measurement conditions including an evaluation length of 30 mm, a measurement velocity of 0.3 mm/s, a cut-off value ($\lambda c$) of 0.25 mm, and a cut-off value ($\lambda f$) of 8.0 mm), and a relative density is 98%".

PRIOR ARTS

Patent Documents

Patent Document 1: Japanese Patent No. 3369819
Patent Document 2: Japanese Unexamined Patent Publication (Kokai) No. 2011-178598

SUMMARY

According to the ceramic sintered body production method and the silicon nitride substrate disclosed in Patent Publications 1 and 2, green sheets, which are plate-shaped ceramic molded bodies, are stacked, and the stack is subjected to sintering while providing a separation layer comprised of boron nitride particles between each of the stacked green sheets, and by adjusting various conditions such as an average particle diameter of the boron nitride particles, an oxygen content, a coating amount, and the like, bonding between the ceramic substrate after sintering can be suppressed, and waviness on the ceramic substrate surface can be suppressed. However, in the prior arts, the ceramic substrate is a silicon nitride substrate which is a sintered body comprising a main phase comprised of silicon nitride particles and an intergranular phase comprised of a sintering aid, and the substrate has a thin thickness of 0.20 to 0.80 mm. With this configuration, obtaining silicon nitride substrates having a surface waviness of 1.00 µm or lower, and having a predetermined bending strength, thermal conductivity and bonding property with a metal plate, at a stable yield rate has been still difficult. The surface waviness refers to an arithmetic average waviness Wa obtained by measuring a filtered centerline waviness using a surface roughness meter. Specifically, an arithmetic average of absolute values of deviation from the average value of surface heights is used. The measurement conditions include an evaluation length of 30 mm, a measurement velocity of 0.3 mm/s, a cut-off value ($\lambda c$) of 0.25 mm, and a cut-off value ($\lambda f$) of 8.0 mm. In addition, in the above-mentioned prior arts, the plurality of stacked ceramic substrates may be bonded at the time of sintering, and thus, separation property of the ceramic substrates to separate the substrates without breaking the substrates after the sintering is insufficient.

The present invention has been invented in view of the drawbacks of the prior arts. The objective of the present invention is to provide a silicon nitride substrate which is a sintered body having a thin thickness of 0.20 to 0.80 mm and comprising a main phase comprised of silicon nitride particles and an intergranular phase comprised of a sintering aid, wherein the silicon nitride substrate has a surface waviness of 1 μm or lower, a desired bending strength, thermal conductivity, and bonding property with a metal plate, and to provide a method for producing a silicon nitride substrate wherein at the time of separating each ceramic substrate from a sintered plurality of stacked ceramic substrates, the silicon nitride substrate can be separated with a high separation property without breaking the ceramic substrate.

In order to achieve the above objective, an embodiment of the present invention is a method for producing a silicon nitride substrate having a thickness t of 0.20 to 0.80 mm. The silicon nitride substrate comprises a main phase mainly comprised of silicon nitride particles, and an intergranular phase mainly comprised of a sintering aid. The method comprises: a separation layer forming step to form a separation layer on a surface of a plate-like molded body containing silicon nitride powder, sintering aid powder, and an organic binder, using a boron nitride paste containing boron nitride powder, an organic binder, and an organic solvent; a degreasing step performed after the separation layer forming step, to heat the separation layer and the molded body at a temperature 15 to 450° C. higher than the exothermic peak temperature of the organic binder of the molded body, to remove the organic binder from the separation layer and the molded body; and a sintering step performed after the degreasing step to sinter the plurality of molded bodies stacked with a separation layer therebetween. The boron nitride paste is composed to contain 0.01 to 0.5% by mass of oxygen (O) and 0.001 to 0.5% by mass of carbon (C) in the boron nitride powder, and to have a carbon (C) content remaining in the separation layer after the degreasing step. When "c" represents an oxygen content (% by mass) in the boron nitride paste, and "a" represents a carbon (C) content (% by mass) in the separation layer after the degreasing step, c/a is in the range of 0.02 to 10.00. In addition, the separation layer formed on the molded body in the separation layer forming step is constituted to contain 0.2 to 3.5 mg/cm² of hexagonal boron nitride powder.

Further, when the sintering step is complete, the ratio (B/Si) between the fluorescent X-ray intensities of boron (B) and silicon (Si), at any selected parts on the surface of the silicon nitride substrate, may be in the range of $7.0 \times 10^{-5}$ to $250 \times 10^{-5}$, and B/C representing the ratio between boron (B) and carbon (C) is from 0.080 to 3.000.

The boron nitride paste may contain 8.75 to 44 parts by mass of the organic binder per 100 parts by mass of the boron nitride powder having an average particle diameter d50 of 4.0 to 20.0 μm, d10 of 0.5 to 7.0 μm, and d90 of 8 to 40 μm.

The boron nitride paste may have a viscosity of 1000 to 50000 cP at 25 to 27° C., and a thixotropy of 1.02 to 4.00, and the separation layer is preferably formed by screen printing in the separation layer forming step.

The thixotropy is a value defined by (viscosity at 10 rpm)/(viscosity at 100 rpm) which is the ratio between viscosities measured at 10 rpm and 100 rpm by a rotary viscometer.

The boron nitride paste may contain 8.75 to 44 parts by mass of the organic binder and further, 80 to 750 parts by mass of organic solvent per 100 parts by mass of the hexagonal boron nitride powder.

The separation layer formed on the molded body in the separation layer forming step may contain 0.5 to 1.4 mg/cm² of hexagonal boron nitride powder. With respect to the ratio (B/Si) between characteristic X-ray intensities of boron (B) and silicon (Si) obtained by linear analysis using an electron probe micro analyzer (EPMA) for a measuring length of 20 mm at any selected parts on the surface of the molded body after the degreasing step, when "f" represents an average value of any selected 10.0 mm sections, and "g" represents an average value of any selected 0.2 mm sections in the 10.0 mm sections, g/f is preferably 0.2 to 7.0.

The exothermic peak temperature of the organic binder contained in the boron nitride paste, measured by differential thermal analysis, may be 5° C. or more higher than the exothermic peak temperature of the organic binder in the molded body.

The boron nitride paste may be produced by blending 8.75 to 44 parts by mass of the organic binder and 80 to 750 parts by mass of the organic solvent, per 100 parts by mass of the boron nitride powder, and stirring for 0.2 to 10 hours.

Another embodiment of the present invention is a silicon nitride substrate which is a sintered body comprising a main phase mainly comprised of silicon nitride particles, and an intergranular phase mainly comprised of a sintering aid. The main phase contains, on the substrate surface, first silicon nitride particles having an aspect ratio obtained by dividing a major axis length by a minor axis length of 3.0 or less, and having a major axis length of 5.0 μm or less, and second silicon nitride particles having a major axis length and an aspect ratio exceeding those of the first silicon nitride particles. There are 40 or less first silicon nitride particles present within a 10 μm square region set on any selected parts on the substrate surface, the ratio (B/Si) between fluorescent X-ray intensities of boron (B) and silicon (Si) on any selected parts on the substrate surface is in range of $7.0 \times 10^{-5}$ to $250 \times 10^5$, the ratio B/C between boron (B) and carbon (C) is 0.080 to 3.000, and further, the surface waviness is 1.00 μm or less, and in addition, the thickness t is 0.20 to 0.80 mm.

With respect to the substrate surface waviness, a filtered centerline waviness is measured using a surface roughness meter, and the arithmetic average waviness Wa, namely, the arithmetic average of absolute values of deviation from the average value of the surface height, is used. The measurement conditions include an evaluation length of 30 mm, a measurement velocity of 0.3 mm/s, a cut-off value (λc) of 0.25 mm, and a cut-off value (λf) of 8.0 mm.

The silicon nitride substrate may contain 40 or less first silicon nitride particles within a 10 μm square region set in any selected parts in the surface layer located at the depth of 20 μm or less from the substrate surface, and contains 30 or less first silicon nitride particles within a 10 μm square region set in any selected parts in the inner layer located at the depth other than the depth of the surface layer from the surface.

The silicon nitride substrate may contain second silicon nitride particles within a 10 μm square region set in any selected parts in the surface layer located at the depth of 20 μm or less from the substrate surface, at the area ratio of 1.0 to 30.0%, the second silicon nitride particle having an aspect ratio of 5.0 to 20.0, and a major axis length of 6.0 to 30.0 μm.

The silicon nitride substrate may contain an aggregation part formed by aggregation of the first silicon nitride particles to have a maximum diameter of 25 μm or less, in a surface layer located at the depth of 20 μm or less from the substrate surface.

The silicon nitride substrate may contain 25 or less aggregation parts within a 100 μm square region set in any selected parts in the surface layer located at the depth of 20 µm or less from the substrate surface.

The silicon nitride substrate may contain 25 or less aggregation parts within a 100 µm square region set in any selected parts in the surface layer located at the depth of 20 µm or less from the substrate surface, and contain 20 or less aggregation parts within a 100 µm square region set in any selected parts in the inner layer located at the depth other than the depth of the surface layer from the surface.

The silicon nitride substrate may contain a pore having a maximum diameter of 10 µm or less and formed in the intergranular phase around the first silicon nitride particle, in the surface layer located at the depth of 20 µm or less from the substrate surface.

The silicon nitride substrate may contain 20 or less pores within a 100 µm square region set in any selected parts in the surface layer located at the depth of 20 µm or less from the substrate surface.

The silicon nitride substrate may have a coefficient of variation of 1.0 or less regarding the characteristic X-ray intensity of boron (B) on the substrate surface, measured by an electron probe micro analyzer (EPMA) at the following conditions.

The measurement conditions of the electron probe micro analyzer are scanning a range of 1 mm at a beam diameter of 1 µm, and measuring fluorescent X-ray intensities of boron (B) at an interval of 2 µm. The value for the coefficient of variation is obtained by dividing the standard deviation of the measured values by the average value thereof.

According to the present invention, the objectives of the present invention described in detail below can be achieved.

Figure 1:
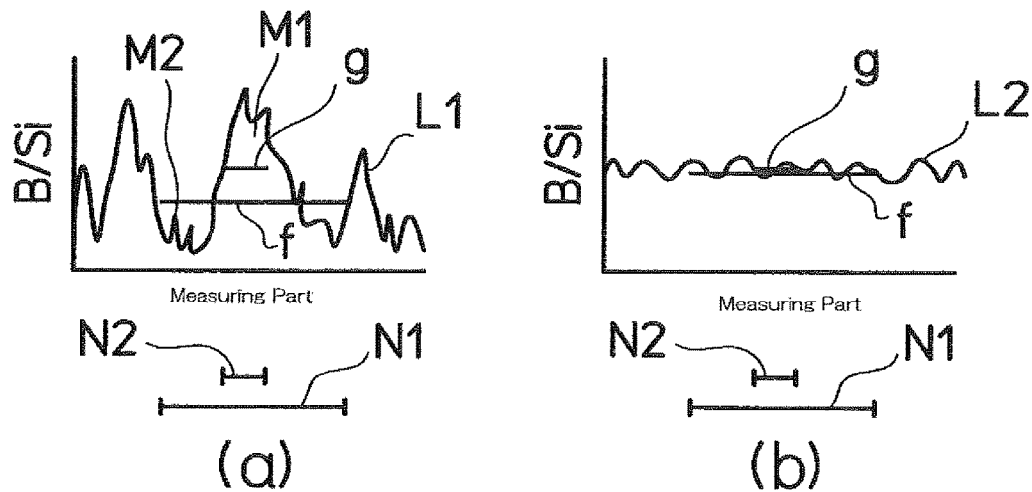
FIG. 1 is a view explaining an index g/f obtained by EPMA.

Hereinbelow, exemplary embodiments of the present invention will be explained with reference to the drawings.

In order to improve the waviness of a silicon nitride substrate, the inventors of the present invention studied the prior arts. As a result, the inventors found that the problem regarding the waviness of the surface cannot be solved in the silicon nitride substrate formed according to the prior arts. It is not clear why this problem of surface waviness cannot be solved, but the following phenomenon is assumed to be one of the causes.

Namely, a boron compound (hereinafter, may be referred to as a B compound) containing oxygen may be formed on the surface of a boron nitride (hereinafter, may be referred to as BN) particle contained in the separation layer formed on the surface of a green sheet. The B compound may be, for example, diboron trioxide ($B_2O_3$).

The BN particles are sparsely/densely distributed in the separation layer formed on the green sheet. When the green sheet is heated in the sintering step, a B compound located at a portion where the BN particles are densely provided acts on a sintering aid which is contained in the surface layer of the green sheet and is present at a particle boundary between the silicon nitride particles, to thereby decrease the melting point of the sintering aid. As a result, an anomalous region having an intergranular phase (hereinafter, this intergranular phase may be conveniently referred to as an anomalous phase for easy understanding) may be formed, the intergranular phase being comprised of boron-containing glass (hereinafter, conveniently referred to as boron glass for easy understanding) having a melting point lower than the melting point of normal glass formed by the sintering aid. Since boron (B) can be easily diffused due to its comparatively small ion radius, and the periphery of the anomalous region cannot be distinguished from the normal region, providing a clear boundary is difficult. However, the region having a clearly higher boron (B) concentration compared to the normal region is assumed to be the anomalous region.

Since the anomalous phase contained in the anomalous region in the surface layer of the green sheet has a low melting point, the anomalous phase melts earlier than other normal intergranular phase, rearrangement of α-type granular silicon nitride particles 9c contained in the anomalous region is initiated. The silicon nitride particles are rearranged so that pores contained in the anomalous region which has been melted to become a liquid phase, disappear, and thus, the anomalous region is contracted. The BN particles contained in the separation layer are sparsely/densely distributed, and thus, it is assumed that when the green sheet is seen in a planar view, a plurality of anomalous regions having different areas are dotted thereon.

Thereafter, when the heating temperature of the green sheet is raised, a normal region also melts, the normal region having an intergranular phase which is comprised of normal glass formed by a sintering aid receiving no actions from a B compound (hereinafter, this intergranular phase may be conveniently referred to as a normal phase for easy understanding). Rearrangement of α-type granular silicon nitride particles contained in the normal region is also initiated, and the normal region is contracted. However, there is a time difference regarding the rearrangement of the silicon nitride particles between the anomalous region and the normal region, due to the difference of respective melting points of the intergranular phases contained in these regions, and therefore, there is a time difference regarding the contraction time of these regions. Namely, there seems to be a phenomenon that the contraction of the anomalous region containing boron glass on which the B compound acts is initiated, and thereafter, the contraction of the normal region on which the B compound does not act is initiated.

Here, it is known that the silicon nitride particle can grow to have a long major axis length when a sintering aid which is a rare-earth oxide such as $Y_2O_3$, etc., coexists. However, in the anomalous region which is present in the surface layer of the green sheet, the boron glass having a lower melting temperature is present as a main component, and thus, the boron glass melts before the silicon nitride particle grows. Thereby, the space which can be used when the silicon nitride particle grows is filled with liquid (which is referred to as densification). As a result, the particle growth of the granular silicon nitride particles contained in the anomalous region does not progress well, and these silicon nitride particles may become silicon nitride particles having a small aspect ratio and a short major axis length. On the other hand, particle growth of the granular silicon nitride particles contained in the normal region progresses well because there is no obstructive factor for their growth. Thus, these silicon nitride particles become columnar silicon nitride particle having a large aspect ratio and a long major axis length. The anomalous region is then pressed by the normal region which contains the columnar silicon nitride particles and is contracted later, so that the anomalous region is deformed to project relative to the surface of the normal region.

The inventors of the present invention considered that the deformation occurring in a very small region by the above-mentioned supposed mechanism, may cause a great waviness when viewing the entire surface of the silicon nitride substrate WB, and assumed that in a thin silicon nitride substrate having a thickness of 0.20 to 0.80 mm, obtaining the surface waviness (Wa) 1 µm or lower is extremely difficult. On the basis of such consideration, the present invention was completed. Namely, silicon nitride substrates are produced while uniformly distributing the B compound on the substrate surface, and reducing the concentration of the B compound, and thereby, a silicon nitride substrate having a reduced surface waviness can be obtained.

An exemplary embodiment of the present invention is a silicon nitride substrate which is a sintered body comprising a main phase mainly comprised of silicon nitride particles, and an intergranular phase mainly comprised of a sintering aid, wherein the main phase contains, in the substrate surface, first silicon nitride particles having an aspect ratio, calculated by dividing a major axis length by a minor axis length, of 3.0, and having a major axis length of 5.0 µm or less, and second silicon nitride particles having a major axis length and an aspect ratio exceeding those of the first silicon nitride particles, 40 or less first silicon nitride particles are present within a 10 µm square region set at any selected parts on the substrate surface, the ratio (B/Si) between fluorescent X-ray intensities of boron (B) and silicon (Si) is in the range or $7.0 \times 10^{-5}$ to $250 \times 10^{-5}$, the ratio B/C between fluorescent X-ray intensities of boron (3) and carbon (C) is 0.080 to 3.000, at any selected parts on the substrate surface, and further, surface waviness is 1.00 µm or less, and the thickness t is 0.20 to 0.80 mm.

As mentioned above, the silicon nitride substrate according to the present embodiment has the ratio (B/Si) between fluorescent X-ray intensities of boron (B) and silicon (Si) in the range or $7.0 \times 10^{-5}$ to $250 \times 10^{-5}$, at any selected parts on the substrate surface. The value B/Si reflects the sum of boron (B) contained in BN constituting the separation layer which is present on the surface of the silicon nitride substrate, and boron (B) contained in the boron glass present in the anomalous region in the surface layer of the silicon nitride substrate, and thus, the value indirectly indicates the amount of boron (B) contained in the anomalous region. Namely, when the value of B/Si is large, it can be assumed that there are many anomalous phases containing boron glass on the surface of the silicon nitride substrate, resulting in the assumption that a large amount of B compound is contained in the BN powder constituting the separation layer formed on one surface of the green sheet. Here, the B/Si is determined to be in the range of $7.0 \times 10^{-5}$ to $250 \times 10^{-5}$, due to the following reasons. Namely, when B/Si is less than $7.0 \times 10^{-5}$, the amount of BN powder constituting the separation layer is too small, and thus, after the sintering, when the plurality of stacked silicon nitride substrates are separated one by one, the separation property is poor, resulting in a low yield ratio. If B/Si exceeds $250 \times 10^{-5}$, when the silicon nitride substrate is bonded to a metal substrate, the bonding may be prevented by the excessive boron (B).

Further, as mentioned above, the silicon nitride substrate has the ratio B/C between fluorescent X-ray intensities of boron (B) and carbon (C) of 0.080 to 3.000. Namely, the silicon nitride substrate according to the present embodiment has an appropriate amount of carbon (C) on its surface. This carbon (C) is the residue of carbon (C) used to reduce oxygen (O) of the 13 compound contained in the separation layer to obtain harmless boron (B). When B/C is less than 0.080, an excessive amount of carbon (C) remains on the surface, resulting in the decrease in the strength of the silicon nitride substrate, and resulting in the poor bonding between the metal substrate and the silicon nitride substrate. On the other hand, if B/C exceeds 3.000, the amount of carbon (C) contained in the separation layer is too small, and thus, the effect of reducing the B compound is insufficient, an anomalous phase containing boron glass is formed on the surface of the silicon nitride substrate by the action of the remaining B compound, and waviness of the silicon nitride substrate cannot be improved.

As mentioned above, the silicon nitride substrate comprises a main phase containing, in the substrate surface, first silicon nitride particles having an aspect ratio, calculated by dividing a major axis length by a minor axis length, of 3.0, and having a major axis length of 5.0 µm or less, and second silicon nitride particles having a major axis length and an aspect ratio exceeding those of the first silicon nitride particles. In view of the value B/Si and the value B/C on the surface of the silicon nitride substrate, it is possible that the B compound contained in the separation layer has been reduced with C to make boron harmless. In the silicon nitride substrate according to the embodiment, it is assumed that oxygen in B compound contained in the separation layer is reduced with carbon (C) to decrease the amount of B compound, and thereby, the amount of anomalous phase containing boron glass formed by the action of B compound is decreased. As a result, the number of first silicon nitride particles experiencing poor particle growth, having an aspect ratio, calculated by dividing a major axis length by a minor axis length, of 3.0 or less, and having a major axis length of 5.0 µm or less, is decreased. Specifically, there are 40 or less first silicon nitride particles present in a 10 µm square region set at any selected parts of the surface.

As mentioned above, in the silicon nitride substrate according to the present embodiment, on the substrate surface, B/Si is $7.0 \times 10^{-5}$ to $250 \times 10^{-5}$, B/C is 0.080 to 3.000, and the number of first silicon nitride particles present in a predetermined square region is 40 or less, and thereby, when the thickness is 0.20 to 0.80 mm, the waviness of the substrate surface can be made 1 µm or less. With respect to the substrate surface waviness, a filtered centerline waviness is measured using a surface roughness meter, and the arithmetic average waviness Wa, namely, the arithmetic average of absolute values of deviation from the average value of the surface heights, is used. The measurement conditions include an evaluation length of 30 mm, a measurement velocity of 0.3 mm/s, a cut-off value ($\lambda$c) of 0.25 mm, and a cut-off value ($\lambda$f) of 8.0 mm.

The silicon nitride substrate according to the present embodiment may contain 40 or less first silicon nitride particles within a 10 µm square region set in any selected parts in the surface layer located at the depth of 20 µm or less from the substrate surface, and contain 30 or less first silicon nitride particles within a 10 µm square region set in any selected parts in the inner layer located at the depth other than the depth of the surface layer from the surface.

Namely, if a large number of first silicon nitride particles are present in the silicon nitride substrate, it is assumed that a large number of anomalous phases are present around the first silicon nitride particles. The boron glass contained in the anomalous phase has an inferior strength compared to the glass constituting the normal phase, and cracks can be easily generated when a stress acts on the silicon nitride substrate. In addition, the first silicon nitride particle has a granular shape having an aspect ratio of 3.0 or less, while the second silicon nitride particle is columnar. Thus, the first silicon nitride particle has a low fracture toughness, and cracks easily progress therein. According to an exemplary embodiment of the silicon nitride substrate, 40 or less first silicon nitride particles are contained in a 10 μm square region set in any selected parts in the surface layer located at the depth of 20 μm or less from the substrate surface. Therefore, the number of anomalous phases having an inferior strength is small, resulting in suppressing the generation of cracks in the surface layer of the silicon nitride substrate even if a stress is applied. In addition, 30 or less first silicon nitride particles are contained in a 10 μm square region set in any selected parts in the inner layer located at the depth other than the depth of the surface layer from the surface. Because the inner layer has a higher fracture toughness compared to the surface layer, even if a crack is generated in the surface layer the progress of the crack can be suppressed, and the silicon nitride substrate can be prevented from being broken.

As mentioned above, the first silicon nitride particle contained in the silicon nitride substrate and the anomalous phase which is considered to be present around the first silicon nitride particle have adverse influences on the properties of the silicon nitride substrate, such as strength, fracture toughness, thermal conductivity, dielectric strength voltage, etc. However, on the premise that the first silicon nitride particle satisfies the above-mentioned conditions, and the granular first silicon nitride particles having a small aspect ratio and a short major axis length are appropriately present in regions formed between the columnar second silicon nitride particles, the silicon nitride substrate can be filled with the silicon nitride particles at a high filling rate, leading to the increase in the density of the silicon nitride substrate, and the increase in the strength and thermal conductivity. The conditions therefor includes that, second silicon nitride particles are contained at a cross-sectional ratio of 1.0 to 30.0% within a 10 square region set in any selected parts in the surface layer located at the depth of 20 μm or less from the substrate surface, the second silicon nitride particle having an aspect ratio of 5.0 to 20.0, and a major axis length of 6.0 to 30.0 μm. If the second silicon nitride particle has an aspect ratio of less than 5.0 or a major axis length of less than 6.0, spaces having appropriate sizes cannot be formed between the second silicon nitride particles. Thus, the first silicon nitride particles cannot be arranged in these spaces, and no effect can be obtained. On the other hand, if the aspect ratio exceeds 20.0 or the major axis length exceeds 30.0 μm, there exist large silicon nitride particles. Thus, even if the first silicon nitride particles are present, a large defect portion can be easily generated, and the strength is decreased. Further, if the second silicon nitride particles are contained at the cross-sectional ratio of less than 1.0%, the amount of first silicon nitride particles arranged in the spaces between the second silicon nitride particles becomes too large, resulting in the formation of a large aggregation part. Thus, various properties of the silicon nitride substrate cannot be achieved. On the other hand, if the second silicon nitride particles are contained at the cross-sectional ratio exceeding 30.0%, there is no space available to arrange the first silicon nitride particles. Thus, the density of the silicon nitride substrate cannot be increased.

The silicon nitride substrate according to the above embodiment may contain an aggregation part formed by the aggregation of the first silicon nitride particles to have a maximum diameter of 25 μm or less, in the surface layer located at the depth of 20 μm or less from the substrate surface. If the aggregation part formed by the aggregation of the first silicon nitride particles is large, inevitably, the anomalous region existing around the aggression part and having a lower strength is large, resulting in the further decrease in the strength and the fracture toughness of the silicon nitride substrate. Accordingly, the aggregation part may have a maximum diameter of 25 μm or less.

Further, the silicon nitride substrate according to the exemplary embodiment may be constituted to contain 25 or less aggregation parts in a 100 μm square region set in any selected parts in the surface layer located at the depth of 20 μm or less from the substrate surface. As mentioned above, when the maximum diameter of the aggregation part is 25 μm or less, a silicon nitride substrate having a desired strength and fracture toughness can be constituted. However, if the silicon nitride substrate contains a large number of aggregation parts, thermal conductivity of the substrate may be decreased. Namely, when a silicon nitride substrate is a sintered body having a main phase comprised of silicon nitride particles and an intergranular phase comprised of a sintering aid, heat is conducted by phonon. Thermal conductivity of the sintered body may be limited by the thermal conductivity of the silicon nitride particle constituting the main phase and the thermal conductivity of the intergranular phase, namely, the thermal conductivity specific to the intergranular phase and volume, thickness, etc., of the intergranular phase.

The second silicon nitride particle discharges impurities within the particle during the particle growth step to become a particle having few impurities, whereas particle growth of the first silicon nitride particle does not progress well, and thus, a large amount of impurities are contained in the particle, resulting in the decrease in thermal conductivity due to phonon scattering. Further, the first silicon nitride particle has a granular shape having an aspect ratio of 3.0 or less and having a short major axis length of 5.0 μm or less. Therefore, when the volumes are the same, the first silicon nitride particles have large surface area compared to the second silicon nitride particles, and a large number of anomalous phases are present around the first silicon nitride particles. Thus, the distribution of phonon for conducting heat is prevented by the anomalous phases. In addition, the anomalous phase contains boron glass having a low thermal conductivity, and thus, when a large number of aggregation parts are present in the silicon nitride substrate, thermal conductivity of the substrate is deceased. In order to constitute a silicon nitride substrate having a high thermal conductivity, for example, thermal conductivity of 80 (W/m·K) or more, 25 or less aggregation parts may be contained in a 100 μm square region set in any selected parts in the surface layer located at the depth of 20 μm or less from the substrate surface.

The silicon nitride substrate according to the exemplary embodiment may contain 25 or less aggregation parts within a 100 μm square region set in any selected parts in the surface layer located at the depth of 20 μm or less from the substrate surface, and contain 20 or less aggregation parts within a 100 μm square region set in any selected parts in the inner layer located at the depth other than the depth of the surface layer from the surface.

Namely, when a large number of aggregation parts are present within a predetermined area in the silicon nitride substrate, it is assumed that a large number of anomalous regions may be present, since the anomalous region is a group of anomalous phases containing the aggregation parts. The anomalous phase contained in the anomalous region has a lower strength compared to the normal phase, and thus, cracks can be easily generated in the anomalous phase when a stress is applied. In addition, the first silicon nitride particle forming the aggregation part has a granular shape having an aspect ratio of 3.0 or less, and thus, the fracture toughness is low and cracks can easily progress. Here, in the silicon nitride substrate according to the exemplary embodiment, 25 or less aggregation parts are contained in a 100 μm square region set in any selected parts in the surface layer located at the depth of 20 μm or less from the substrate surface. Thus, the number of anomalous regions having a lower strength is small, and even if a stress is applied to the silicon nitride substrate, generation of cracks in the surface layer of the silicon nitride substrate can be suppressed. In addition, 20 or less aggregation parts are contained in a 100 μm square region set in any selected parts in the inner layer located at the depth other than the depth of the surface layer from the surface. Because the inner layer has a higher fracture toughness compared to the surface layer, even if a crack is generated in the surface layer, the progress of the crack can be suppressed, and the silicon nitride substrate can be prevented from being broken.

Further additionally, the silicon nitride substrate according to the embodiment may have a pore having a maximum diameter of 10 μm or less and formed in the intergranular phase around the first silicon nitride particle, in the surface layer located at the depth of 20 μm or less from the substrate surface. As mentioned above, there is a time difference regarding the contraction initiating time between the anomalous phase and the normal phase, caused the difference of melting points of these phases, and thus, pores can be easily generated around the boundary of these phases. The pore contained in the silicon nitride substrate may become the origin of a crack when a stress is applied, resulting in the breakage of the silicon nitride substrate and the decrease of the thermal conductivity and dielectric strength voltage. On the other hand, in the silicon nitride substrate according to the embodiment, maximum diameter of the pore is 10 μm or less, and thus, the strength and thermal conductivity of the silicon nitride substrate can be increased, and the dielectric strength voltage thereof can be improved. Due to the similar reasons, it is further preferable that 20 or less pores are present within a 100 μm square region set in any selected parts in the surface layer located at the depth of 20 μm or less from the substrate surface.

Further additionally, the silicon nitride substrate according to the exemplary embodiment has a coefficient of variation of 1.0 or less regarding the characteristic X-ray intensity of boron (B) on the substrate, measured by an electron probe micro analyzer (EPMA) under the following conditions. The measurement conditions of the electron probe micro analyzer include scanning a range of 1 mm at a beam diameter of 1 μm, and measuring fluorescent X-ray intensities of boron (B) at an interval of 2 μm. The coefficient of variation is calculated by dividing the standard deviation of the measured values of characteristic X-ray intensity by the average value thereof. The relationship between the coefficient of variation and the surface waviness of the silicon nitride substrate is assumed as follows. The value of boron (B) measured by EPMA can be considered as the sum the boron (B) amount contained in BN present on the surface of the silicon nitride substrate, and the boron (B) amount contained in the boron glass present in the anomalous region in the surface layer of the silicon nitride substrate, but can be assumed to indicate the boron (B) amount contained in the anomalous region. Namely, if the coefficient of variation obtained by dividing the standard deviation of the characteristic X-ray intensities of B by the average value thereof is small, the characteristic X-ray intensities of B being obtained by the measurement at a plurality of points on the surface of the silicon nitride substrate using EPMA, it is predicted that the BN constituting the separation layer uniformly remains on the surface of the silicon nitride substrate and also, the anomalous regions are uniformly present in the surface layer of the silicon nitride substrate. Here, if the BN remaining on the surface of the silicon nitride substrate is sparsely/densely distributed, when the silicon nitride substrate and the metal substrate are bonded to form a circuit board, the bonding of these substrates can be prevented by the portion where the BN is densely distributed, and voids can be easily generated at the bonding boundary. However, the silicon nitride substrate according to the present embodiment has a coefficient of variation of boron (B) of 1.0 or less, to suppress the sparse/dense distribution of the BN and suppress the number of densely distributed portions, resulting in the increase in the bonding between the silicon nitride substrate and the metal substrate. Further, if the anomalous regions are sparsely/densely distributed in the surface layer of the silicon nitride substrate, waviness of the silicon nitride substrate surface tends to increase. However, in the silicon nitride substrate according to the present embodiment, because the coefficient of variation of boron (B) is 1.0 or less, the sparse/dense distribution of the anomalous regions can be suppressed, resulting in the decrease in the number of densely distributed portions and the decrease of waviness of the silicon nitride substrate surface.

Since the silicon nitride substrate according to the present embodiment is constituted as mentioned above, a silicon nitride substrate having a bending strength of 600 (MPa) or more can be provided, and further, a silicon nitride substrate having a thermal conductivity of 80 (W/m·k) or more can be provided.

Further, since the silicon nitride substrate according to the present embodiment is constituted as mentioned above, when the silicon nitride substrate is bonded with the metal substrate and the obtained bonded body is subjected to a thermal resistance cycling test, the silicon nitride substrate can achieve a high pass rate for the test. Specifically, a plurality of bonded bodies are produced, each bonded body being produced using the silicon nitride substrate having a thickness of 0.20 to 0.80 mm, a length of 40 mm, and a width of 30 mm, the silicon nitride substrate being provided on its front surface with a copper plate having thickness of 0.5 mm, a length of 37 mm, and a width of 26 mm, and being provided on its rear surface with a copper plate having a thickness of 0.5 mm, a length of 37 mm, and a width 27 mm, and the silicon nitride substrate and each of the copper plates being bonded through a 20 μm-thick brazing material layer made of a brazing material to form the bonded body. When the plurality of bonded bodies are subjected to the thermal resistance cycling test, 90% or more of the bonded bodies comprised of the silicon nitride substrate is not broken after 3000 cycles or more. Here, the brazing material is prepared by adding 10 parts by mass of Ag powder particles having an average particle diameter of 10 μm, and 1 part by mass of titanium hydride, 85% or more of the titanium hydride having a particle size of 45 μm or less, to 100 parts by mass of alloy powder having an average particle diameter of 20 μm and consisting of Ag: 70% by mass, In: 5% by mass, oxygen content 0.1% by mass or less, residue consisting of Cu, and inevitable impurities; and mixing the Ag powder particles and the activated metal hydride to fill the gap between the alloy powder particles, and thereby, a brazing material having a melting point of 770° C. can be obtained. The obtained brazing material is blended with 5% by mass, relative to the entire paste, of acrylic resin functioning as a binder, 10% by mass of α-terpineol functioning as a solvent, and 0.1% by mass of alkylbenzene sulfonate which is a low molecular anionic compound functioning as a dispersant, and the obtained blended material is mixed using a planetary mixer to have a viscosity of 55 Pa·s. Further, during the thermal resistance cycling test, a plurality of temperature rising/temperature lowering cycles are repeatedly applied to the circuit board, one cycle including cooling at −40° C. for 20 minutes, holding at a room temperature for 10 minutes, and heating at 125° C. for 20 minutes.

The silicon nitride substrate according to the embodiment is constituted as above, and thus, when the bonded body formed by bonding the silicon nitride substrate with the metal substrate is subjected to an insulation test, the silicon nitride substrate can achieve a high pass rate for the test. Specifically, when a plurality of bonded bodies similar to those subjected to the thermal resistance cycling test, are subjected to the insulation test, insulation breakdown does not occur in 90% or more of the bonded bodies made of the silicon nitride substrate. In the insulation test, a 5 kV voltage is applied to the circuit board for 1 minute.

Another exemplary embodiment of the present invention is a method for producing a silicon nitride substrate comprising a main phase mainly comprised of silicon nitride particles, and an intergranular phase mainly comprised of a sintering aid, and having a thickness t of 0.20 to 0.80 mm, wherein the method comprising: a separation layer forming step to form a separation layer on a surface of a plate-like molded body containing silicon nitride powder, sintering aid powder, and an organic binder, using a boron nitride paste containing boron nitride powder, an organic binder, and an organic solvent; a degreasing step performed after the separation layer forming step, to heat the separation layer and the molded body at a temperature 15 to 450° C. higher than the exothermic peak temperature of the organic binder of the molded body, to remove the organic binder from the separation layer and the molded body; and a sintering step performed after the degreasing step to sinter the plurality of molded bodies stacked with a separation layer therebetween, and wherein the boron nitride paste is composed to contain 0.01 to 0.5% by mass of oxygen (O) and 0.001 to 0.5% by mass of carbon (C) in the boron nitride powder, and to have a carbon (C) content remaining in the separation layer after the degreasing step; when "c" represents an oxygen content (% by mass) in the boron nitride powder of the boron nitride paste, and "a" represents a carbon (C) content (% by mass) in the separation layer after the degreasing step, c/a is in the range of 0.02 to 10.00; and the separation layer formed on the molded body in the separation layer forming step is constituted to contain 0.2 to 3.5 mg/cm$^2$ of hexagonal boron nitride powder.

The organic binder to be mixed with the silicon nitride powder may be, for example, polyvinyl butyral, methyl methacrylate resin, and the like. The organic binder to be used for the boron nitride paste may be, for example, polyvinyl butyral, ethyl cellulose, and the like. The organic solvent to be used for the boron nitride paste may be, for example, ethanol, butanol, α-terpineol, and the like. The sintering aid may be, for example, $Y_2O_3$, MgO, and the like.

According to the method for producing a silicon nitride substrate of the embodiment, in the separation layer forming step, a separation layer is formed on the surface of the plate-like molded body (green sheet) containing silicon nitride powder, sintering aid powder, and an organic binder, by a doctor blade method or other known molding method, using a boron nitride (BN) paste containing boron nitride (BN) powder, an organic binder, and an organic solvent. The green sheet having a separation layer formed on its surface, is heated in the degreasing step, and thereby, the organic binder contained in the green sheet is removed (degreased), and the organic binder and the organic solvent contained in the BN paste are also removed. Therefore, after the degreasing step, the BN paste is degreased from the surface of the green sheet, and a layer containing the BN powder from which the organic binder and the organic solvent have been removed, and carbon (C) which is the residue of the organic binder is formed (hereinbelow, this separation layer after the degreasing step may be conveniently referred to as a BN layer). A plurality of green sheets each having the BN layer formed thereon, are stacked with a BN layer therebetween, and the stacked body is sintered in the sintering step, to form a silicon nitride substrate comprising a main phase mainly comprised of silicon nitride particles, and a intergranular phase mainly comprised of a sintering aid.

Further, in the method for producing a silicon nitride substrate having a thickness t of 0.20 to 0.80 mm, according to the present embodiment, the BN paste used in the separation layer forming step contains 0.01 to 0.5% by mass of oxygen (O) and 0.001 to 0.5% by mass of carbon (C) in the boron nitride powder, and when "c" represents an oxygen content (% by mass) in the boron nitride powder of the boron nitride paste, and "a" represents a carbon (C) content (% by mass) remaining in the BN layer after the degreasing step to degrease the green sheet at a temperature 15 to 450° C. higher than the exothermic peak temperature of the organic binder of the green sheet, c/a is in the range of 0.02 to 10.00. The reasons why the ratio of oxygen (O) in the BN powder, the degreasing temperature in the degreasing step, and the ratio of carbon (C) relative to the ratio of oxygen (O) contained in the BN powder after the completion of the degreasing step, are determined as mentioned above will be explained below.

First, the reason for the ratio of the oxygen (O) in the BN powder will be explained. The ratio of oxygen (O) in the BN powder is determined from two points in the sintering step, which are: a fixing strength between the green sheet and the BN particles constituting the BN powder; and a melting point of glass formed when the sintering aid contained in the green sheet melts. Namely, when the ratio of oxygen (O) contained in the BN powder is less than 0.01% by mass, reaction between the BN particles and the green sheet surface which is in contact with the BN particles, rarely occurs, and thus, fixing strength of the BN particles to the green sheet surface is decreased. Therefore, when contraction of the green sheet occurs in the sintering step, some BN particles may move on the green sheet surface, resulting in the sparse/dense distribution of the BN powder in the sintering step. Therefore, the separation property of sintered silicon nitride substrate may be decreased, and surface waviness may be increased. On the other hand, if the ratio of oxygen (O) contained in the BN powder exceeds 0.5% by mass, the excessive oxygen (O) acts on the sintering aid and lower the melting point thereof. Therefore, contraction of the green sheet cannot be sufficiently performed in the sintering step, and a result, the density of the silicon nitride substrate cannot be increased, and a silicon nitride substrate having a high strength and heat conductivity cannot be obtained.

Next, the reason for the degreasing temperature in the degreasing step will be explained. The degreasing temperature is determined from two points which are: the amount of carbon (C) which is a residue of the organic binder contained in the green sheet after the degreasing step; and preventing the alteration of the silicon nitride particles contained in the green sheet. Namely, if the green sheet is degreased at a temperature less than 15° C. higher than the exothermic peak temperature of the organic binder of the green sheet measured by the differential thermal analysis, a large amount of carbon (C) remains in the degreased green sheet. In the sintering step, the silicon nitride particle are reduced by the remaining carbon (C), and thus, particle growth of the silicon nitride particles may be prevented, and the fracture toughness of the silicon nitride substrate may be decreased. On the other hand, if the green sheet is degreased at a temperature more than 450° C. higher than the exothermic peak temperature of the organic binder of the green sheet measured by the differential thermal analysis, the silicon nitride particles contained in the green sheet are oxidized, and as a result, the density of the silicon nitride substrate cannot be increased, and a silicon nitride substrate having a high strength and heat conductivity cannot be obtained. If the exothermic peak temperature measured by the differential thermal analysis includes a plurality of peaks, the temperature corresponding to the peak which appears closest to the high temperature side may be treated as an exothermic peak temperature.

The reason for the ratio of carbon (C) relative to the ratio of oxygen (O) contained in the BN powder after the completion of the degreasing step will be explained below. As mentioned in the paragraph describing the reason for determining the ratio of oxygen (O) contained in the BN powder, the ratio of oxygen (O) contained in the BN powder is determined from two points in the sintering step, which are: a fixing strength between the green sheet and the BN particles constituting the BN powder; and a melting point of glass formed when the sintering aid contained in the green sheet melts. On the other hand, the value indicating the ratio of oxygen (O) contained in the BN powder is a value of oxygen (O) in a B compound formed on the surface of the BN particle constituting the BN powder.

Here, as mentioned above, the BN paste used in the method for producing a silicon nitride substrate according to the present embodiment is constituted so that the B compound forming the anomalous phase containing boron glass, that is, the B compound contained in the BN layer which is a separation layer after the degreasing step, is reduced by carbon (C) in the sintering step to make the B compound harmless. Namely, the BN paste of the embodiment is constituted so that, after the degreasing at the degreasing temperature in the above-mentioned range, an appropriate amount of carbon, which is a residue of the organic binder, remains in the BN layer, and the amount of carbon contained in the BN layer after the degreasing step becomes larger than the amount of carbon (C) contained in the BN particles of the BN paste. When "c" represents an oxygen content (% by mass) in the BN powder, and "a" represents a carbon (C) content (% by mass) remaining in the BN layer after the degreasing step, if c/a exceeds 10.00, the B compound cannot be sufficiently reduced, and more than an allowable number of anomalous phases are formed, resulting in the increase in the density of the first silicon nitride particles present in the silicon nitride substrate. On the other hand, if c/a is less than 0.02, the strength of the silicon nitride substrate is reduced due to the excessive carbon (C), and the bonding property between the silicon nitride substrate and the metal substrate is disturbed due to the carbon (C) present on the surface of the silicon nitride substrate.

Though it is not apparent, it is assumed that the carbon (C) which is originally contained in the BN powder forms a compound in the BN powder, and thus, does not effectively acts for reducing the B oxides, compared to the C which remains in the BN powder after the degreasing step. Therefore, as mentioned above, an appropriate amount of carbon (C) may remain in the BN powder after the degreasing step.

Further, the reason why the separation layer formed on the molded body in the separation layer forming step in the a method for producing a silicon nitride substrate according to the present embodiment, is constituted to contain 0.2 to 3.5 mg/cm$^2$ of hexagonal BN powder, is as follows. If the amount of hexagonal BN powder exceeds 3.5 mg/cm$^2$, particle growth of the excessive hexagonal BN powder occurs in the green sheet sintering step, resulting in the formation of projections and recesses by columnar silicon nitride particles exposed on the surface. The BN powder enters into the recesses to prevent the uniform contraction of the green sheet. As a result, the obtain silicon nitride substrate tends to have a large surface waviness. On the other hand, if the amount of the hexagonal BN powder is less than 0.2 mg/cm$^2$, portions having a small amount of hexagonal BN powder are formed. Thereby, the stacked silicon nitride substrates may be adhered in the sintering step, and the separation property is decreased. From a similar view point, the amount of hexagonal BN powder contained in the separation layer is preferably from 0.4 to 2.2 mg/cm$^2$.

In the method for producing a silicon nitride substrate according to the present embodiment, after the completion of the sintering step, the ratio (B/Si) between the fluorescent X-ray intensities of boron (B) and silicon (Si), at any selected parts on the surface of the silicon nitride substrate, is in the range of $7.0 \times 10^{-5}$ to $250 \times 10^{-5}$, and B/C representing the ratio between boron (B) and carbon (C) is from 0.080 to 3.000. The reasons for these features are described above.

Specifically, the BN paste can be formed by blending 8.75 to 44 parts by mass of the organic binder per 100 parts by mass of the boron nitride powder having an average particle diameter d50 of 4.0 to 20.0 μm, d10 of 0.5 to 7.0 μm, and d90 of 8 to 40 μm. In order to prevent the aggregation of the BN powder, a dispersant can be added, if necessary. Here, the average particle diameter d50 of the BN powder is determined to be 4.0 to 20.0 μm, because if the average particle diameter d50 is less than 4.0 μm, projections and recesses are formed by columnar silicon nitride particles exposed on the surface, the BN powder enters into the recesses to prevent the uniform contraction of the green sheet, as a result, the obtain silicon nitride substrate has a large surface waviness. On the other hand, if the average particle diameter d50 exceeds 20.0 μm, adherence of the BN powder to the green sheet surface is reduced, and the green sheets may be easily removed while being handled after the lamination. The average particle diameter d10 is determined to be 0.5 to 7.0 μm because if the average particle diameter d10 is less than 0.5 μm, the ratio of the B compound contained in the BN layer becomes too large. On the other hand, if the average particle diameter d10 exceeds 7.0 μm, the ratio of the B compound contained in the BN layer becomes too small. If the ratio of the B compound formed on the BN particle surface is small, reaction between the BN particles and the green sheet surface which is in contact with the BN particles, rarely occurs, and thus, fixing strength of the BN particles to the green sheet surface is decreased. Therefore, when contraction of the green sheet occurs in the sintering step, some BN particles may move on the green sheet surface, resulting in the sparse/dense distribution of the BN powder in the sintering step. Therefore, the separation property of sintered silicon nitride substrate may be decreased, and surface waviness may be increased. Further the average particle diameter d90 is determined to be 8 to 40 µm, because if the average particle diameter d90 is less than 8 µm, the ratio of the B compound contained in the BN layer becomes too large. On the other hand, if the average particle diameter d90 exceeds 40 µm, the BN particles in the BN layer may have too large diameters, and waving caused by the shape of the large particles may be generated on the surface of the silicon nitride substrate.

Further, in the method for producing a silicon nitride substrate according to the present embodiment, the BN paste may have a viscosity of 1000 to 50000 cP and a thixotropy of 1.02 to 4.00, at 25 to 27° C., and the separation layer may be formed by screen printing in the separation layer forming step. The thixotropy is a value defined by (viscosity at 10 rpm)/(viscosity at 100 rpm) which is the ratio between viscosities measured at 10 rpm and 100 rpm by a rotary viscometer. Specifically, the BN paste contains 8.75 to 44 parts by mass of the organic binder and further, 80 to 750 parts by mass of organic solvent per 100 parts by mass of the hexagonal boron nitride powder.

In the method for producing a silicon nitride substrate according to the present embodiment, hexagonal BN powder can be used as BN powder contained in the BN paste. Using the BN paste containing substantially plate-like hexagonal BN particles, and adjusted to have a viscosity of 1000 to 50000 cP and a thixotropy of 1.02 to 4.00, the separation layer is formed by screen printing in the separation layer forming step. Thereby, the separation layer can be formed by arranging the flat faces of the hexagonal BN particles to be substantially parallel so the surface of the green sheet, that is, arranging the c-axes of the hexagonal BN particles to be substantially perpendicular to the surface of the green sheet. Such separation layers and the green sheets provided with the separation layers are degreased together in the degreasing step, and thereafter, sintered in the sintering step while a plurality of green sheets are stacked with a separation layer therebetween. Here, hexagonal BN particles are uniformly arranged in the direction mentioned above in the separation layer separating the stacked green sheet. Therefore, frictional resistance between the green sheets which contract in the sintering step can be reduced, and the entire green sheets uniformly contract. Accordingly, a silicon nitride substrate having a further reduced surface waviness can be formed.

In the above BN paste, if the viscosity is less than 1000 cP, the shape holding property of the separation layer which is a printed pattern formed by screen printing is poor, and the thickness of the separation layer becomes uneven, and the hexagonal BN powder is sparsely/densely distributed in the separation layer. On the other hand, if the viscosity exceeds 50000 cP, the printed separation layer may have defects such as blurs, and similarly, the hexagonal BN powder is sparsely/densely distributed. The green sheets stacked through such a separation layer having sparsely/densely distributed hexagonal BN powder, include portions in which the hexagonal BN powder is densely arranged, and portions in which the hexagonal BN powder is sparsely arranged. As a result, when the stacked green sheets are sintered, due to the difference in frictional resistance caused by the uneven distribution of the hexagonal BN powder in the separation layer, the contraction amount of each portion in the green sheet may be different, and thus, the uniform contraction of the entirety of the green sheet cannot occur. Therefore, the surface waviness of the silicon nitride substrate may not be reduced.

Further, if the BN paste has a thixotropy of less than 1.02, spreading by a squeegee in screen printing becomes difficult due to the high viscosity of the BN paste, and thus, arranging the hexagonal BN particles in the above-mentioned direction becomes difficult, and the surface waviness of the silicon nitride substrate may not be reduced. On the other hand, if the thixotropy exceeds 4.00, viscosity of the BN paste is low when the paste is spread by a squeegee during screen printing, and thus, the shape holding property of the printed separation layer becomes poor, and the thickness of the separation layer becomes uneven, resulting in the sparse/dense distribution of the hexagonal BN powder in the separation layer. Therefore, the surface waviness of the silicon nitride substrate may not be reduced.

With respect to the ratio (B/Si) between characteristic X-ray intensities of boron (B) and silicon (Si) obtained by linear analysis using an electron probe micro analyzer (EPMA) for a measuring length of 20 mm at any selected parts on the surface of the molded body after the degreasing step, when "f" represents an average value of any selected 10.0 mm sections, and "g" represents an average value of any selected 0.2 mm sections in the 10.0 mm sections, g/f may be 0.2 to 7.0.

With respect to the ratio (B/Si) between characteristic X-ray intensities of boron (B) and silicon (Si) obtained by linear analysis using an electron probe micro analyzer (EPMA) for a measuring length of 20 mm at any selected parts on the surface of the molded body after the degreasing step, when "f" represents an average value of any selected 10.0 mm sections, and "g" represents an average value of any selected 0.2 mm sections in the 10.0 mm sections, the reasons why g/f is 0.2 to 0.7, are described below.

Namely, the above index g/f macroscopically defines the sparse/dense status of the hexagonal BN powder contained in the separation layer formed on the surface of the molded, the sparse/dense status having an influence on the surface waviness of the silicon nitride substrate. Here, FIG. 1(a) shows the ratio (B/Si) between characteristic X-ray intensities of boron (B) and silicon (Si) obtained by linear analysis using an electron probe micro analyzer (EPMA) for a measuring length of 20 mm at any selected parts on the surface of the molded body after the degreasing step. As shown by the solid line L1 in FIG. 1(a), the values of the ratio B/Si varies within predetermined variation while containing a large peak M1, a small peak M2, etc. The sparse/dense status of the hexagonal BN powder can be defined by obtaining the dispersion of the varying B/Si values, but this is not appropriate because the value of the small peak M2 which has no direct influence to the waviness of the silicon nitride substrate surface, is included in the values for obtaining the dispersion. Therefore, the inventors of the present invention have conceived of the above-mentioned definition for appropriately evaluating the large peak M1 of the solid line L1, which directly relates to the waviness of the silicon nitride substrate surface.

As shown in FIG. 1 (a), from the B/Si values obtained by an electron probe micro analyzer (EPMA) for a measuring length of 20 mm, an average value f of the B/Si values at any selected 10.0 mm section N1 is obtained. The reasons why the average value f of the 10.0 mm section N1 is obtained are described below. Then, an average value g of the B/Si values at any selected 0.2 mm section N2 contained in the 10.0 mm section N1 is obtained. By averaging the B/Si values of the 0.2 mm section N2 in the 10.0 mm section N1, the contribution of the peak M2 in the solid line L1 to the average value g becomes lower, and thus, the large peak M1 which has a great influence to the waviness of the silicon nitride substrate surface can be appropriately evaluated. The 0.2 mm section N2 can be set at any portions where the large peak M1 is present in the 10.0 mm section N1. However, it is also possible, for example, to obtain average values g at a plurality of 0.2 mm sections in the 10.0 mm section N1, and use an average value or the maximum value of the plurality of average values g for the index g/f.

On the other hand, it is not appropriate to evaluate the sparse/dense distribution of the hexagonal BN powder only from the average value g of the 0.2 mm section N2, because, as shown by the solid line L2 in FIG. 1(b), even in the case that the average value f of the 10.0 mm section N1 is high and the variation range of the values of 10.0 mm section N1 is small, the average value g of the 0.2 mm sections N2 is the same as that in FIG. 1 (a). Then, the average value g of the 0.2 mm section N2 is divided by the average value f of 10.0 mm section N1 to obtain to obtain a dimensionless index g/f, and use the index for evaluating the sparse/dense distribution of the hexagonal BN powder contained in the separation layer.

When this index g/f for sparse/dense distribution of the hexagonal BN powder is less than 0.2, the average value g of the B/Si at the 0.2 mm section is relatively low, and a portion having a relatively sparse distribution of the hexagonal BN powder is present on the surface of the green sheet. On the other hand, when the index g/f exceeds 0.7, the average value g of the B/Si at the 0.2 mm section is relatively high, and a portion having a relatively dense distribution of the hexagonal BN powder is present on the surface of the green sheet. Here, even if the average value f at the 10.0 mm section is high, the green sheets are stacked through a separation layer having a relatively sparse distribution part and a relatively dense distribution part of the hexagonal BN powder, and thus, the green sheet has a potion to be in contact with the relatively sparse distribution part and a portion to be in contact with the relatively dense distribution part. As a result, when the stacked green sheets are sintered, due to the difference in frictional resistance caused by the relatively sparsesparse/dense distribution of the hexagonal BN powder in the separation layer, the degrees of contraction are different among respective parts in the green sheet, and uniform contraction over the entirety of the green sheet cannot be performed. Thus, the waviness of the silicon nitride substrate surface may not be reduced.

Further, according to the method for producing a silicon nitride substrate of the present embodiment, in the measurement using differential thermal analysis, the exothermic peak temperature of the organic binder contained in the BN paste may be 5° C. or more higher than that of the organic binder contained in the green sheet. Here, if the organic binder contained in the BN paste is degreased before the degreasing of the organic binder contained in the molded body, the BN powder which is arranged on the surface of the molded body after the BN paste is degreased, is moved by the gas generated when the molded body is degreased, resulting in the formation of sparse/dense distribution of the BN powder. In order to suppress this phenomenon, the exothermic peak temperature of the organic binder contained in the BN paste may be made 5° C. or more higher than that of the organic binder contained in the green sheet so that the organic binder contained in the molded body is degreased first, and thereafter the organic binder contained in the BN paste is degreased.

In the present embodiment, the BN paste may be produced by mixing 8.75 to 44 parts by mass of organic binder and 80 to 750 parts by mass of organic solvent to 100 parts by mass of boron nitride powder, and stirring the mixture for 0.2 to 10 hours. If the organic binder is less than 8.75 parts by mass, or the organic solvent exceeds 750 parts by mass, the BN paste may have a viscosity of less than 1000 cP, and a thixotropy less than 1.02. If the organic binder exceeds 44 parts by mass, or the organic solvent is less than 80 parts by mass, the BN paste may have a viscosity of more than 50000 cP, and a thixotropy of more than 4.00. Further, if the stirring time is less than 0.2 hours, the BN paste may have a viscosity more than 50000 cP, and a thixotropy of more than 4.00. If the stirring time exceeds 10 hours, the BN paste may have a viscosity of less than 1000 cP, a thixotropy or less than 1.02.

EXAMPLES

Hereinbelow, specific examples of the present invention will be explained. However, the present invention is not limited to these examples.

In Examples and Comparative Examples described below, the constitution of a circuit board incorporating a produced silicon nitride substrate as an insulation substrate is to be explained.

[Circuit Board]

Figure 2:
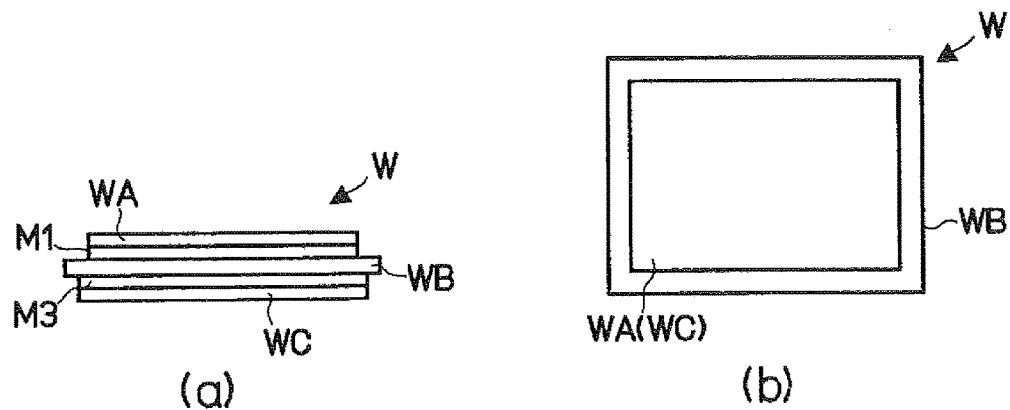
FIG. 2 is a view explaining a schematic structure of a circuit board incorporating a silicon nitride substrate according to an embodiment of the present invention.

As shown in FIGS. 2 (a) and (b), a circuit board W comprises a silicon nitride substrate WB, a metal substrate WA bonded on the upper surface (one surface) of the silicon nitride substrate WB with a brazing material layer M1 therebetween, and a plate-like metal substrate WC bonded on the lower surface (the other surface) of the silicon nitride substrate WB with a brazing material layer M3 therebetween. The metal substrate WA bonded on the upper surface of the silicon nitride substrate WB functions as a circuit plate on which a semiconductor element is mounted, whereas the metal substrate WC bonded on the lower surface of the silicon nitride substrate WB functions as a radiator plate. The circuit board W formed in each of the following Examples and Comparative Examples has a silicon nitride substrate WB having a length (the size in the horizontal direction in FIG. 2(a)) of 40 mm, a width (the size in the vertical direction in FIG. 2(a)) of 30 mm, a metal substrate WA having a thickness of 0.5 mm, a length of 36 mm, and a width of 26 mm, and a metal substrate WA having a thickness of 0.5 mm, a length of 37 mm, and a width of 27 mm. The brazing material layers M1 and M2 each has a length and a width substantially the same as those of the metal substrates WA and WC, and has a thickness of 20 μm.

The metal substrates WA and WC are not limited as far as they can be bonded with a brazing material, and have a melting point higher than that of the brazing material. The metal substrates WA and WC may be, for example, copper, copper alloy, aluminum, aluminum alloy, silver, silver alloy, nickel, nickel alloy, nickel-plated molybdenum, nickel-plated tungsten, nickel-plated iron alloy, and the like. Among them, using copper as a metal member is most preferable in view of electric resistance, a stretching property, a high heat conductivity (low thermal resistance), a small degree of migration, and so on. Using aluminum for the metal member is preferable because aluminum has a plastic deformability and thus, is reliable when mounted in a cooling/heating cycle, although aluminum is inferior to copper in terms of electric resistance, and high heat conductivity (low thermal resistance). When placing importance on electric resistance, the use of silver is preferable. When placing more importance on reliability after the bonding than electrical properties, molybdenum and tungsten are preferable because their thermal expansion rates are similar to that of the silicon nitride substrate WB, and thus, thermal stress at the time of bonding can be reduced.

The circuit board W can be formed by forming each circuit board W as shown in FIG. 2 (a), (b). However, usually, in order to efficiently manufacture circuit boards W in industrial production at a low cost, as shown in FIG. 7(c), a plurality of circuit boards W are formed in matrix using a large silicon nitride substrate WB, and then, each piece is separated along with the dotted line CB in the drawing. Hereinbelow, production of a large silicon nitride substrate WB for forming 12 circuit boards W will be explained, by way of example, in each of Examples and Comparative Examples. Further in each of Examples and Comparative Examples, the silicon nitride substrate WE is bonded on its opposite surfaces with the metal substrates WA and WC to form a circuit board W, and the circuit board W is subjected to a thermal resistance cycling test and a insulation resistance test. Thus, production steps of the circuit board W performed after the production of the silicon nitride substrate WE will be also explained.

Hereinbelow, Examples 1 to 43 and Comparative Examples 1 to 7 will be explained.

[Raw Material Mixing Step]

A silicon nitride substrates in Examples 1 to 43 and Comparative Examples 1 to 7 were formed by the method mentioned below. Mixed powder of silicon nitride powder, and MgO and $Y_2O_3$ as sintering aids was prepared in the ratio shown in Table 1. Average particle diameters (d50) of the silicon nitride powder, the MgO powder, and the $Y_2O_3$ powder were 0.1 to 2 μm, 0.1 to 2 μm, and 0.1 to 2 μm, respectively. The mixed powder and silicon nitride balls functioning as crushing bodies were put a in resin pot of a ball mill filled with an ethanol-butanol solution (organic solvent), and were subjected to wet mixing for 4 hours. Next, an organic binder of the kind and the ratio shown in Table 1 was added to the mixed powder in the pot, and subjected to wet mixing for 12 hours, to thereby obtain slurry for molding sheets. For the organic binder, polyvinyl butyral or a methyl methacrylate resin each having the exothermic peak temperature (A1) shown in Table 1 was used. The exothermic peak temperature (A1) of the organic binder contained in the slurry for forming sheets was measured by differential thermal analysis, and is a temperature corresponding to the peak shown closest to the high temperature side.

TABLE 1

| | Constitution of Molded Body | | | | | |
|---|---|---|---|---|---|---|
| | Silicon Nitride Powder Composition % by mass | Sintering Aid | | Organic Binder | | |
| | | MgO % by mass | $Y_2O_3$ % by mass | Kind | Peak Exothermic Temperature (A1) °C. | Composition % by mass |
| Example 1 | 94 | 3 | 3 | polyvinyl butyral | 430 | 15 |
| Example 2 | 94 | 3 | 3 | polyvinyl butyral | 430 | 15 |
| Example 3 | 94 | 3 | 3 | polyvinyl butyral | 430 | 15 |
| Example 4 | 94 | 3 | 3 | polyvinyl butyral | 430 | 15 |
| Example 5 | 94 | 3 | 3 | polyvinyl butyral | 430 | 15 |
| Example 6 | 94 | 3 | 3 | polyvinyl butyral | 430 | 15 |
| Example 7 | 94 | 3 | 3 | polyvinyl butyral | 430 | 15 |
| Example 8 | 94 | 3 | 3 | polyvinyl butyral | 430 | 15 |
| Example 9 | 94 | 3 | 3 | polyvinyl butyral | 430 | 15 |
| Example 10 | 94 | 3 | 3 | polyvinyl butyral | 430 | 15 |
| Example 11 | 94 | 3 | 3 | polyvinyl butyral | 430 | 15 |
| Example 12 | 94 | 3 | 3 | polyvinyl butyral | 430 | 15 |
| Example 13 | 94 | 3 | 3 | polyvinyl butyral | 430 | 15 |
| Example 14 | 94 | 3 | 3 | polyvinyl butyral | 430 | 15 |
| Example 15 | 94 | 3 | 3 | polyvinyl butyral | 430 | 15 |
| Example 16 | 94 | 3 | 3 | polyvinyl butyral | 430 | 15 |
| Example 17 | 94 | 3 | 3 | polyvinyl butyral | 430 | 15 |
| Example 18 | 94 | 3 | 3 | polyvinyl butyral | 430 | 15 |

TABLE 1-continued

| | Constitution of Molded Body | | | | | |
| --- | --- | --- | --- | --- | --- | --- |
| | Silicon Nitride | Sintering Aid | | | Organic Binder | |
| | | | | | Peak Exothermic | |
| | Powder Composition % by mass | MgO % by mass | Y₂O₃ % by mass | Kind | Temperature (A1) ° C. | Composition % by mass |
| Example 19 | 94 | 3 | 3 | polyvinyl butyral | 430 | 15 |
| Example 20 | 94 | 3 | 3 | polyvinyl butyral | 430 | 15 |
| Example 21 | 94 | 3 | 3 | polyvinyl butyral | 430 | 15 |
| Example 22 | 94 | 3 | 3 | polyvinyl butyral | 430 | 15 |
| Example 23 | 94 | 3 | 3 | polyvinyl butyral | 430 | 15 |
| Example 24 | 94 | 3 | 3 | methyl methacrylate resin | 360 | 18 |
| Example 25 | 94 | 3 | 3 | methyl methacrylate resin | 360 | 18 |
| Example 26 | 93 | 3 | 4 | methyl methacrylate resin | 360 | 18 |
| Example 27 | 93 | 3 | 4 | methyl methacrylate resin | 360 | 18 |
| Example 28 | 93 | 3 | 4 | methyl methacrylate resin | 360 | 18 |
| Example 29 | 93 | 3 | 4 | methyl methacrylate resin | 360 | 18 |
| Example 30 | 93 | 3 | 4 | methyl methacrylate resin | 360 | 18 |
| Example 31 | 93 | 3 | 4 | methyl methacrylate resin | 360 | 18 |
| Example 32 | 93 | 3 | 4 | methyl methacrylate resin | 360 | 18 |
| Example 33 | 93 | 3 | 4 | methyl methacrylate resin | 360 | 18 |
| Example 34 | 94 | 3 | 3 | methyl methacrylate resin | 360 | 18 |
| Example 35 | 94 | 3 | 3 | methyl methacrylate resin | 360 | 18 |
| Example 36 | 93 | 3 | 4 | methyl methacrylate resin | 360 | 18 |
| Example 37 | 93 | 3 | 4 | methyl methacrylate resin | 360 | 18 |
| Example 38 | 94 | 3 | 3 | polyvinyl butyral | 430 | 15 |
| Example 39 | 94 | 3 | 3 | polyvinyl butyral | 430 | 15 |
| Example 40 | 94 | 3 | 3 | polyvinyl butyral | 430 | 15 |
| Example 41 | 94 | 3 | 3 | polyvinyl butyral | 430 | 15 |
| Example 42 | 94 | 3 | 3 | polyvinyl butyral | 430 | 15 |
| Example 43 | 94 | 3 | 3 | polyvinyl butyral | 430 | 15 |
| Comparative Example 1 | 94 | 3 | 3 | polyvinyl butyral | 430 | 15 |
| Comparative Example 2 | 94 | 3 | 3 | polyvinyl butyral | 430 | 15 |

TABLE 1-continued

| | Constitution of Molded Body | | | | | |
|---|---|---|---|---|---|---|
| | Silicon Nitride | Sintering Aid | | Organic Binder | | |
| | Powder Composition % by mass | MgO % by mass | $Y_2O_3$ % by mass | Kind | Peak Exothermic Temperature (A1) °C. | Composition % by mass |
| Comparative Example 3 | 94 | 3 | 3 | polyvinyl butyral | 430 | 15 |
| Comparative Example 4 | 94 | 3 | 3 | polyvinyl butyral | 430 | 15 |
| Comparative Example 5 | 94 | 3 | 3 | polyvinyl butyral | 430 | 15 |
| Comparative Example 6 | 94 | 3 | 3 | polyvinyl butyral | 430 | 15 |
| Comparative Example 7 | 94 | 3 | 3 | polyvinyl butyral | 430 | 15 |

[Green Sheet Forming Step]

The slurry for molding was subjected to defoaming and solvent removal to adjust the viscosity, and a green sheet was molded by a doctor blade method. Next, the molded green sheet was heated in the air to remove the organic solvent. Thus a green sheet having a size of 150 mm in length, 150 mm in width, and 0.4 mm in thickness, and having a composition shown in Table 1 was obtained. The thickness of the green sheet was 1.3 mm in Example 25, 0.32 mm in Example 38, 1.6 mm in Comparative Example 1, 0.3 mm in Comparative Example 2, and 0.48 mm in Comparative Example 7.

[Separation Layer Forming Step]

In order to form a separation layer on the upper surface (one surface) of the green sheet, BN paste containing BN powder was prepared. For each Example and Comparative Example, the BN powder, the organic binder, and the organic solvent were blended in the ratio shown in Table 2, and were mixed using a planetary mixer, and thereby, the BN paste was produced. For the organic binder, polyvinyl butyral or ethyl cellulose each having the exothermic peak temperature (A5) shown in Table 2 was used. For each Example and Comparative Example, Table 2 shows the kind of BN powder, particle size distribution (d10, d50, d90), composition (A2), oxygen content (c), carbon content (b) in the BN powder, kind and composition of the organic binder (A4), difference between the exothermic peak temperatures of the organic binder contained in the BN paste and the organic binder contained in the molded body (A5-A1), and composition of the organic solvent. In Examples 1 to 41 and Comparative Examples 1 to 6, the BN paste was mixed for 40 minutes, and the viscosity and thixotropy of the produced BN paste, and a method for forming separation layer using the BN paste are shown in Table 3. The thixotropy is a value defined by the ratio (viscosity at 10 rpm)/(viscosity at 100 rpm), i.e., the ratio of viscosities measured a 10 rpm and 100 rpm by a rotary viscometer. Similar to the description above, the exothermic peak temperature (A5) of the organic binder contained in the BN paste was measured by differential thermal analysis, and is a temperature corresponding to the peak shown closest to the high temperature side.

TABLE 2

| | Constitution of Boron Nitride Paste | | | | | | | | | |
|---|---|---|---|---|---|---|---|---|---|---|
| | d10 μm | d50 μm | d90 μm | Oxygen Content (c) in Boron Nitride Powder % by mass | Carbon Content (b) in Boron Nitride Powder % by mass | Organic Binder | | | | Organic Solvent Composition part by mass |
| | | | | | | Kind | Composition: A4 part by mass | exothermic peak temperature: A5 °C. | A5 − A1 °C. | |
| Example 1 | 0.5 | 4 | 8 | 0.5 | 0.03 | polyvinyl butyral | 8.75 | 435 | 5 | 130 |
| Example 2 | 1.2 | 5.2 | 17 | 0.4 | 0.03 | polyvinyl butyral | 11.2 | 435 | 5 | 130 |
| Example 3 | 1.6 | 6.5 | 14.8 | 0.3 | 0.05 | polyvinyl butyral | 11.55 | 435 | 5 | 130 |
| Example 4 | 0.5 | 4 | 8 | 0.5 | 0.05 | polyvinyl butyral | 12.25 | 435 | 5 | 130 |
| Example 5 | 0.5 | 4 | 8 | 0.5 | 0.5 | polyvinyl butyral | 21 | 450 | 20 | 85 |
| Example 6 | 0.5 | 4 | 8 | 0.5 | 0.1 | polyvinyl butyral | 26 | 450 | 20 | 85 |
| Example 7 | 1.2 | 5.2 | 17 | 0.4 | 0.03 | polyvinyl butyral | 35 | 450 | 20 | 85 |

TABLE 2-continued

| | | | | Constitution of Boron Nitride Paste | | | | | |
|---|---|---|---|---|---|---|---|---|---|
| | | | | Oxygen Content (c) in Boron Nitride Powder % by mass | Carbon Content (b) in Boron Nitride Powder % by mass | | Organic Binder | | Organic Solvent Composition part by mass |
| | d10 μm | d50 μm | d90 μm | | | Kind — | Composition: A4 part by mass | exothermic peak temperature: A5 ° C. | A5 − A1 ° C. | |
| Example 8 | 1.6 | 6.5 | 14.8 | 0.3 | 0.03 | polyvinyl butyral | 44 | 450 | 20 | 80 |
| Example 9 | 1.2 | 5.2 | 17 | 0.4 | 0.03 | polyvinyl butyral | 8.75 | 435 | 5 | 750 |
| Example 10 | 1.2 | 5.2 | 17 | 0.4 | 0.03 | polyvinyl butyral | 11.55 | 435 | 5 | 750 |
| Example 11 | 1.2 | 5.2 | 17 | 0.4 | 0.5 | polyvinyl butyral | 26 | 450 | 20 | 750 |
| Example 12 | 0.5 | 4 | 8 | 0.5 | 0.5 | polyvinyl butyral | 44 | 450 | 20 | 750 |
| Example 13 | 1.2 | 5.2 | 17 | 0.4 | 0.03 | polyvinyl butyral | 8.75 | 470 | 40 | 750 |
| Example 14 | 1.2 | 5.2 | 17 | 0.4 | 0.03 | polyvinyl butyral | 8.75 | 470 | 40 | 450 |
| Example 15 | 1.2 | 5.2 | 17 | 0.4 | 0.03 | polyvinyl butyral | 8.75 | 470 | 40 | 250 |
| Example 16 | 1.2 | 5.2 | 17 | 0.4 | 0.02 | polyvinyl butyral | 8.75 | 470 | 40 | 250 |
| Example 17 | 1.2 | 5.2 | 17 | 0.4 | 0.02 | polyvinyl butyral | 8.75 | 470 | 40 | 140 |
| Example 18 | 1.2 | 5.2 | 17 | 0.4 | 0.02 | polyvinyl butyral | 8.75 | 470 | 40 | 140 |
| Example 19 | 1.2 | 5.2 | 17 | 0.4 | 0.02 | polyvinyl butyral | 8.75 | 470 | 40 | 140 |
| Example 20 | 1.2 | 5.2 | 17 | 0.4 | 0.02 | polyvinyl butyral | 8.75 | 470 | 40 | 140 |
| Example 21 | 1.2 | 5.2 | 17 | 0.4 | 0.02 | polyvinyl butyral | 8.75 | 470 | 40 | 140 |
| Example 22 | 1.2 | 5.2 | 17 | 0.4 | 0.03 | polyvinyl butyral | 8.75 | 470 | 40 | 750 |
| Example 23 | 1.2 | 5.2 | 17 | 0.4 | 0.03 | polyvinyl butyral | 8.75 | 470 | 40 | 750 |
| Example 24 | 1.2 | 5.2 | 17 | 0.4 | 0.03 | polyvinyl butyral | 8.75 | 470 | 110 | 750 |
| Example 25 | 1.2 | 5.2 | 17 | 0.4 | 0.001 | polyvinyl butyral | 8.75 | 470 | 110 | 130 |
| Example 26 | 1.2 | 5.2 | 17 | 0.4 | 0.001 | polyvinyl butyral | 8.75 | 470 | 110 | 130 |
| Example 27 | 1.2 | 5.2 | 17 | 0.4 | 0.03 | polyvinyl butyral | 11.20 | 470 | 110 | 130 |
| Example 28 | 1.6 | 6.5 | 14.8 | 0.3 | 0.03 | polyvinyl butyral | 11.55 | 450 | 90 | 130 |
| Example 29 | 1.6 | 6.5 | 14.8 | 0.3 | 0.03 | polyvinyl butyral | 12.25 | 450 | 90 | 130 |
| Example 30 | 1.6 | 6.5 | 14.8 | 0.3 | 0.03 | ethyl cellulose | 21 | 470 | 110 | 95 |
| Example 31 | 1.6 | 6.5 | 14.8 | 0.3 | 0.2 | ethyl cellulose | 26 | 470 | 110 | 95 |
| Example 32 | 1.6 | 6.5 | 14.8 | 0.3 | 0.2 | ethyl cellulose | 35 | 470 | 110 | 95 |
| Example 33 | 1.6 | 6.5 | 14.8 | 0.3 | 0.08 | ethyl cellulose | 44 | 470 | 110 | 90 |
| Example 34 | 1.6 | 6.5 | 14.8 | 0.3 | 0.08 | ethyl cellulose | 44 | 470 | 110 | 90 |
| Example 35 | 1.6 | 6.5 | 14.8 | 0.3 | 0.08 | ethyl cellulose | 44 | 470 | 110 | 90 |
| Example 36 | 1.6 | 6.5 | 14.8 | 0.3 | 0.08 | ethyl cellulose | 44 | 470 | 110 | 90 |
| Example 37 | 1.6 | 6.5 | 14.8 | 0.3 | 0.08 | ethyl cellulose | 44 | 470 | 110 | 90 |
| Example 38 | 7 | 20 | 40 | 0.01 | 0.001 | polyvinyl butyral | 8.75 | 450 | 20 | 130 |
| Example 39 | 1.2 | 5.2 | 17 | 0.4 | 0.1 | polyvinyl butyral | 44 | 450 | 20 | 90 |
| Example 40 | 1.2 | 5.2 | 17 | 0.4 | 0.03 | polyvinyl butyral | 8.75 | 450 | 20 | 130 |

TABLE 2-continued

Constitution of Boron Nitride Paste

| | d10 μm | d50 μm | d90 μm | Oxygen Content (c) in Boron Nitride Powder % by mass | Carbon Content (b) in Boron Nitride Powder % by mass | Organic Binder Kind | Composition: A4 part by mass | exothermic peak temperature: A5 °C. | A5 − A1 °C. | Organic Solvent Composition part by mass |
|---|---|---|---|---|---|---|---|---|---|---|
| Example 41 | 0.5 | 4 | 8 | 0.5 | 0.03 | polyvinyl butyral | 8.75 | 435 | 5 | 750 |
| Example 42 | 1.2 | 5.2 | 17 | 0.4 | 0.02 | polyvinyl butyral | 8.75 | 470 | 40 | 140 |
| Example 43 | 1.2 | 5.2 | 17 | 0.4 | 0.02 | polyvinyl butyral | 8.75 | 470 | 40 | 140 |
| Comparative Example 1 | 1.2 | 5.2 | 17 | 0.4 | 0.03 | polyvinyl butyral | 45 | 450 | 20 | 130 |
| Comparative Example 2 | 1.2 | 5.2 | 17 | 0.4 | 0.03 | polyvinyl butyral | 8.75 | 450 | 20 | 130 |
| Comparative Example 3 | 0.4 | 3 | 7 | 0.7 | 0.03 | polyvinyl butyral | 8.75 | 450 | 20 | 130 |
| Comparative Example 4 | 8 | 10 | 21 | 0.004 | 0.03 | polyvinyl butyral | 44 | 450 | 20 | 90 |
| Comparative Example 5 | 1.2 | 5.2 | 17 | 0.4 | 0.03 | polyvinyl butyral | 8.75 | 435 | 5 | 130 |
| Comparative Example 6 | 1.2 | 5.2 | 17 | 0.4 | 0.02 | polyvinyl butyral | 8.05 | 450 | 20 | 130 |
| Comparative Example 7 | 1.2 | 5.2 | 17 | 0.4 | 0.03 | polyvinyl butyral | 8.75 | 470 | 40 | 140 |

TABLE 3

| | Boron Nitride Paste Properties | | Separation Layer |
|---|---|---|---|
| | viscosity cP | thixotropy | Forming Method |
| Example 1 | 22000 | 1.2 | Screen Printing |
| Example 2 | 24000 | 1.3 | Screen Printing |
| Example 3 | 22000 | 1.4 | Screen Printing |
| Example 4 | 24000 | 1.5 | Screen Printing |
| Example 5 | 46000 | 2.8 | Screen Printing |
| Example 6 | 47000 | 3 | Screen Printing |
| Example 7 | 48000 | 3.2 | Screen Printing |
| Example 8 | 50000 | 4 | Screen Printing |
| Example 9 | 1000 | 1.02 | Screen Printing |
| Example 10 | 1200 | 1.04 | Screen Printing |
| Example 11 | 1500 | 1.05 | Screen Printing |
| Example 12 | 1800 | 1.05 | Screen Printing |
| Example 13 | 1200 | 1.03 | Screen Printing |
| Example 14 | 4000 | 1.1 | Screen Printing |
| Example 15 | 7000 | 1.2 | Screen Printing |
| Example 16 | 10000 | 1.2 | Screen Printing |
| Example 17 | 15000 | 1.9 | Screen Printing |
| Example 18 | 18000 | 1.4 | Screen Printing |
| Example 19 | 22000 | 1.5 | Screen Printing |
| Example 20 | 22000 | 1.5 | Screen Printing |
| Example 21 | 22000 | 1.5 | Screen Printing |
| Example 22 | 1200 | 1.05 | Screen Printing |
| Example 23 | 1200 | 1.05 | Screen Printing |
| Example 24 | 1200 | 1.05 | Screen Printing |
| Example 25 | 25000 | 1.7 | Screen Printing |
| Example 26 | 25000 | 1.7 | Screen Printing |
| Example 27 | 27000 | 1.9 | Screen Printing |
| Example 28 | 23000 | 1.4 | Screen Printing |
| Example 29 | 24000 | 1.5 | Screen Printing |
| Example 30 | 30000 | 2 | Screen Printing |
| Example 31 | 33000 | 2.1 | Screen Printing |
| Example 32 | 37000 | 2.4 | Screen Printing |
| Example 33 | 41000 | 2.8 | Screen Printing |
| Example 34 | 41000 | 2.8 | Screen Printing |
| Example 35 | 41000 | 2.8 | Screen Printing |
| Example 36 | 41000 | 2.8 | Screen Printing |
| Example 37 | 41000 | 2.8 | Screen Printing |
| Example 38 | 14000 | 1.4 | Screen Printing |
| Example 39 | 42000 | 2.4 | Screen Printing |
| Example 40 | 23000 | 1.7 | Screen Printing |
| Example 41 | 1000 | 1.05 | Spray Coating |
| Example 42 | 22000 | 1.5 | Screen Printing |
| Example 43 | 22000 | 1.5 | Screen Printing |
| Comparative Example 1 | 35000 | 2.2 | Screen Printing |
| Comparative Example 2 | 23000 | 1.7 | Screen Printing |
| Comparative Example 3 | 26000 | 1.8 | Screen Printing |
| Comparative Example 4 | 35000 | 2.2 | Screen Printing |
| Comparative Example 5 | 10000 | 1.1 | Screen Printing |
| Comparative Example 6 | 30000 | 1.5 | Screen Printing |
| Comparative Example 7 | 22000 | 1.5 | Screen Printing |

Figure 6:
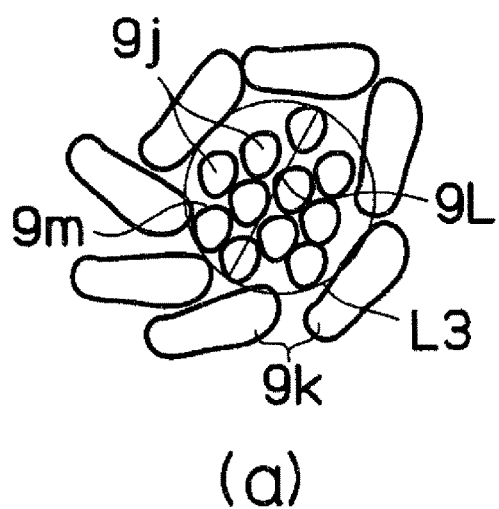
FIG. 6 is a view explaining a method for producing a silicon nitride substrate according to an embodiment of the present invention.
Figure 6:
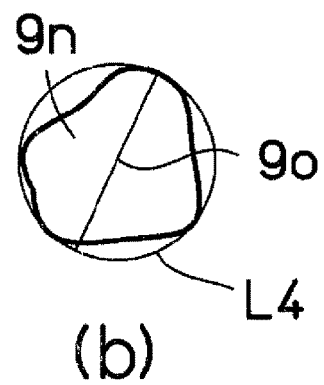

Using the above-mentioned BN paste, a separation layer 1 was formed on the upper surface of the green sheet Wb, as shown in FIG. 6 (a). Regarding the separation layer in each of the Examples and Comparative Examples, Table 4 shows, a thickness, mass per unit area of the BN powder contained in the separation layer, average value g for the 0.2 mm section by EPMA as described above, average value f for the 10.0 mm section, and ratio g/f. The thickness of each separation layer shown in Table 4 is a value measured after the green sheet formed with the separation layer was heated at 120° C. and the organic solvent was removed from the separation layer.

indicates a degreasing temperature (A6), content rate (a) of carbon (C) in the BN layer after the completion of the degreasing step, the difference a−b between the content rate (b) of carbon in the BN powder of the BN paste and the content rate (a) of carbon (c) in the BN layer after the degreasing step, the ratio c/a between the content rate of oxygen (c) in the BN powder of the BN paste and the content rate of carbon (a) in the BN layer after the degreasing step, and the difference (A6−A1) between the exothermic peak temperature (A1) and the degreasing temperature (A6) of the organic binder contained in the green sheet.

TABLE 4

| | | Constitution of Separation Layer | | | |
|---|---|---|---|---|---|
| | | | Ratio of intensities B/Si by Electron Probe Linear Analysis | | |
| | Thickness μm | Boron Nitride Powder Content mg/cm² | 0.2 mm section average (g) | 10.0 mm section average (g) | g/f |
| Example 1 | 4 | 0.8 | 1.05 | 0.15 | 7 |
| Example 2 | 6 | 1 | 0.45 | 0.15 | 3 |
| Example 3 | 7 | 1.2 | 0.374 | 0.17 | 2.2 |
| Example 4 | 6 | 1 | 0.368 | 0.16 | 2.3 |
| Example 5 | 8 | 1.4 | 0.38 | 0.2 | 1.9 |
| Example 6 | 4 | 1 | 0.238 | 0.17 | 1.4 |
| Example 7 | 4 | 1 | 0.234 | 0.18 | 1.3 |
| Example 8 | 4 | 1.2 | 0.238 | 0.17 | 1.4 |
| Example 9 | 4 | 0.2 | 0.15 | 0.1 | 1.5 |
| Example 10 | 4 | 0.2 | 0.096 | 0.08 | 1.2 |
| Example 11 | 6 | 0.6 | 0.216 | 0.12 | 1.8 |
| Example 12 | 4 | 0.2 | 0.02 | 0.1 | 0.2 |
| Example 13 | 4 | 0.4 | 0.14 | 0.1 | 1.4 |
| Example 14 | 4 | 0.6 | 0.169 | 0.13 | 1.3 |
| Example 15 | 4 | 0.7 | 0.264 | 0.12 | 2.2 |
| Example 16 | 4 | 0.8 | 0.299 | 0.13 | 2.3 |
| Example 17 | 4 | 0.9 | 0.39 | 0.15 | 2.6 |
| Example 18 | 4 | 1 | 0.406 | 0.14 | 2.9 |
| Example 19 | 6 | 1.1 | 0.768 | 0.16 | 4.8 |
| Example 20 | 5 | 1 | 0.57 | 0.15 | 3.8 |
| Example 21 | 4 | 0.8 | 0.455 | 0.13 | 3.5 |
| Example 22 | 4 | 0.3 | 0.252 | 0.09 | 2.8 |
| Example 23 | 4 | 0.3 | 0.216 | 0.08 | 2.7 |
| Example 24 | 4 | 0.3 | 0.25 | 0.1 | 2.5 |
| Example 25 | 1 | 0.4 | 0.68 | 0.1 | 6.8 |
| Example 26 | 8 | 1.3 | 1.17 | 0.18 | 6.5 |
| Example 27 | 4 | 0.8 | 0.35 | 0.14 | 2.5 |
| Example 28 | 4 | 0.7 | 0.308 | 0.14 | 2.2 |
| Example 29 | 4 | 0.8 | 0.336 | 0.14 | 2.4 |
| Example 30 | 4 | 0.8 | 0.345 | 0.15 | 2.3 |
| Example 31 | 4 | 0.8 | 0.304 | 0.16 | 1.9 |
| Example 32 | 4 | 0.7 | 0.234 | 0.13 | 1.8 |
| Example 33 | 4 | 0.8 | 0.238 | 0.14 | 1.7 |
| Example 34 | 4 | 0.8 | 0.238 | 0.14 | 1.7 |
| Example 35 | 4 | 0.8 | 0.238 | 0.14 | 1.7 |
| Example 36 | 5 | 1 | 0.289 | 0.17 | 1.7 |
| Example 37 | 6 | 1.2 | 0.306 | 0.18 | 1.7 |
| Example 38 | 10 | 0.8 | 0.81 | 0.15 | 5.4 |
| Example 39 | 4 | 0.8 | 0.33 | 0.15 | 2.2 |
| Example 40 | 4 | 0.8 | 0.375 | 0.15 | 2.5 |
| Example 41 | 4 | 0.3 | 1.05 | 0.15 | 7 |
| Example 42 | 12 | 2.2 | 0.42 | 0.22 | 1.9 |
| Example 43 | 20 | 3.4 | 0.48 | 0.26 | 1.8 |
| Comparative Example 1 | 4 | 0.8 | 0.36 | 0.15 | 2.4 |
| Comparative Example 2 | 4 | 0.8 | 0.345 | 0.15 | 2.3 |
| Comparative Example 3 | 4 | 0.8 | 0.33 | 0.15 | 2.2 |
| Comparative Example 4 | 4 | 0.8 | 0.3 | 0.15 | 2 |
| Comparative Example 5 | 4 | 0.15 | 1.35 | 0.15 | 9 |
| Comparative Example 6 | 4 | 3.7 | 0.39 | 0.15 | 2.6 |
| Comparative Example 7 | 4 | 0.8 | 0.375 | 0.15 | 2.5 |

[Degreasing Step]

The green sheet Wb formed with the separation layer 1 was heated in the air (oxygen atmosphere) to degrease (remove) the organic binder. For each Example, Table 5

TABLE 5

| | Degreasing Step | | | | Sintering Step |
|---|---|---|---|---|---|
| | Degreasing Temperature (A6) °C. | Ratio of Carbon (a) % by mass | a − b % by mass | c/a | A6 − A1 °C. | Sintering Temperature °C. |
| Example 1 | 445 | 0.05 | 0.02 | 10 | 15 | 1900 |
| Example 2 | 450 | 0.05 | 0.02 | 8.4 | 20 | 1900 |
| Example 3 | 450 | 0.09 | 0.04 | 3.2 | 20 | 1900 |
| Example 4 | 450 | 0.23 | 0.18 | 2.2 | 20 | 1900 |
| Example 5 | 500 | 5 | 4.5 | 0.1 | 70 | 1900 |
| Example 6 | 500 | 6.25 | 6.15 | 0.08 | 70 | 1900 |
| Example 7 | 600 | 8 | 7.97 | 0.05 | 170 | 1900 |
| Example 8 | 600 | 15 | 14.97 | 0.02 | 170 | 1900 |
| Example 9 | 450 | 0.07 | 0.04 | 6 | 20 | 1850 |
| Example 10 | 450 | 0.125 | 0.095 | 3.2 | 20 | 1850 |
| Example 11 | 600 | 5 | 4.5 | 0.08 | 170 | 1850 |
| Example 12 | 600 | 25 | 24.5 | 0.02 | 170 | 1850 |
| Example 13 | 600 | 0.06 | 0.03 | 7 | 170 | 1850 |
| Example 14 | 600 | 0.06 | 0.03 | 7 | 170 | 1850 |
| Example 15 | 600 | 0.05 | 0.02 | 8 | 170 | 1850 |
| Example 16 | 600 | 0.04 | 0.02 | 10 | 170 | 1850 |
| Example 17 | 600 | 0.04 | 0.02 | 10 | 170 | 1850 |
| Example 18 | 600 | 0.04 | 0.02 | 10 | 170 | 1850 |
| Example 19 | 600 | 0.04 | 0.02 | 10 | 170 | 1850 |
| Example 20 | 600 | 0.04 | 0.02 | 10 | 170 | 1850 |
| Example 21 | 600 | 0.04 | 0.02 | 10 | 170 | 1850 |
| Example 22 | 600 | 0.10 | 0.07 | 4 | 170 | 1850 |
| Example 23 | 770 | 0.10 | 0.07 | 4 | 340 | 1850 |
| Example 24 | 770 | 0.13 | 0.10 | 3 | 410 | 1850 |
| Example 25 | 770 | 0.04 | 0.04 | 10 | 410 | 1850 |
| Example 26 | 770 | 0.04 | 0.04 | 10 | 410 | 1850 |
| Example 27 | 770 | 0.05 | 0.02 | 8.4 | 410 | 1850 |
| Example 28 | 750 | 0.09 | 0.06 | 3.2 | 390 | 1850 |
| Example 29 | 750 | 0.14 | 0.11 | 2.2 | 390 | 1850 |
| Example 30 | 480 | 3 | 2.97 | 0.1 | 120 | 1850 |
| Example 31 | 480 | 3.8 | 3.6 | 0.08 | 120 | 1850 |
| Example 32 | 480 | 6 | 5.8 | 0.05 | 120 | 1850 |
| Example 33 | 480 | 15 | 14.92 | 0.02 | 120 | 1850 |
| Example 34 | 480 | 15 | 14.92 | 0.02 | 120 | 1900 |
| Example 35 | 480 | 15 | 14.92 | 0.02 | 120 | 1880 |
| Example 36 | 480 | 15 | 14.92 | 0.02 | 120 | 1830 |
| Example 37 | 480 | 15 | 14.92 | 0.02 | 120 | 1800 |
| Example 38 | 600 | 0.002 | 0.001 | 5 | 170 | 1850 |
| Example 39 | 600 | 13.3 | 13.2 | 0.03 | 170 | 1850 |
| Example 40 | 600 | 0.04 | 0.01 | 10 | 170 | 1850 |
| Example 41 | 445 | 0.05 | 0.02 | 10 | 15 | 1850 |
| Example 42 | 600 | 0.05 | 0.03 | 8 | 170 | 1850 |
| Example 43 | 600 | 0.07 | 0.05 | 6 | 170 | 1850 |
| Comparative Example 1 | 600 | 0.27 | 0.24 | 1.5 | 170 | 1850 |
| Comparative Example 2 | 600 | 0.04 | 0.01 | 10 | 170 | 1850 |
| Comparative Example 3 | 600 | 0.05 | 0.02 | 13 | 170 | 1850 |
| Comparative Example 4 | 600 | 0.4 | 0.37 | 0.01 | 170 | 1850 |
| Comparative Example 5 | 450 | 0.04 | 0.01 | 10 | 20 | 1850 |
| Comparative Example 6 | 600 | 0.03 | 0.01 | 13 | 170 | 1850 |
| Comparative Example 7 | 900 | 0.03 | 0.00 | 13.3 | 470 | 1850 |

[Sintering Step]

20 pieces of green sheet Wb subjected to the degreasing step were stacked with a separation layer 1 between each piece, and the stacked body was placed in a baking furnace F as shown in FIG. 6(b), and heated at the temperature shown in Table 5 for each Example and Comparative Example for 5 hours. Thereby, a flat plate-like sintered body, i.e., a silicon nitride substrate was obtained. Thereafter, as shown in FIG. 6 (c), separation layer 1 remaining on the surface of the sintered body WB was removed by a honing process. The honing process was performed by spraying alumina abrasive grains having an average particle diameter (d50) of 10 to 100 μm as a medium G onto the sintered body surface for 1 to 360 seconds.

[Metal Substrate Bonding Step]

As shown in FIG. 6 (d), brazing paste m1 and m3 containing an Ag—Cu—In based active brazing material is coated on the opposite surfaces of the silicon nitride substrate WB by screen printing to have 50 μm thick rectangular regions, and thereafter, dried in a drying furnace for 30 minutes to thereby remove the solvent in the brazing material paste. The brazing paste m1 and m3 used in each of the Examples and Comparative Examples was prepared by adding 10 parts by mass of Ag powder particles having an average particle diameter of 10 μm, and 1 part by mass of titanium hydride 85% or more of which having a particle size of 45 μm or less, to 100 parts by mass of alloy powder consisting of Ag: 70% by mass, In 5% by mass, oxygen content 0.1% by mass or less, residue: Cu, and inevitable impurities, and mixing so that the Ag powder particles and active metal hydride are filled in gaps between alloy powder particles to have a brazing material having a melting point of 770° C. The mixture was further mixed with 5% by mass, per the total mass of the paste, of an acrylic resin as a binder, 10% by mass of α-terpineol as a solvent, and 0.1% by mass of a dispersant, using a planetary mixer to have a viscosity of 55 Pa·s.

Figure 7:
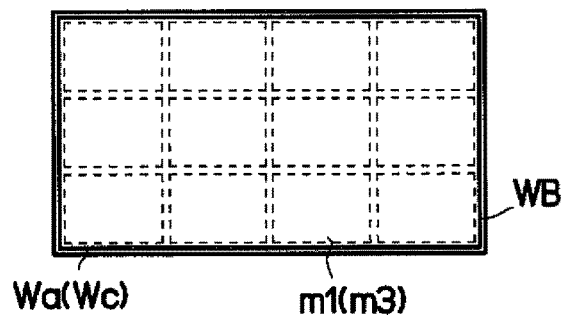
FIG. 7 is another view explaining a method for producing a silicon nitride substrate according to an embodiment of the present invention.
Figure 7:
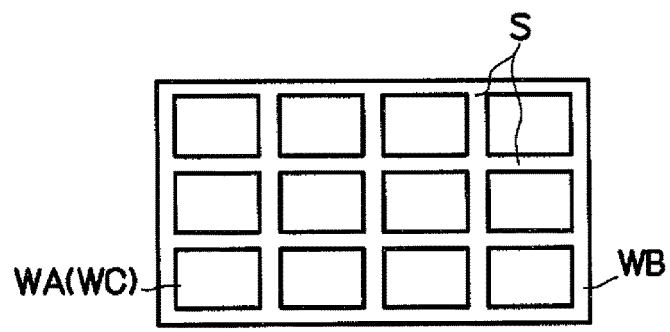
Figure 7:
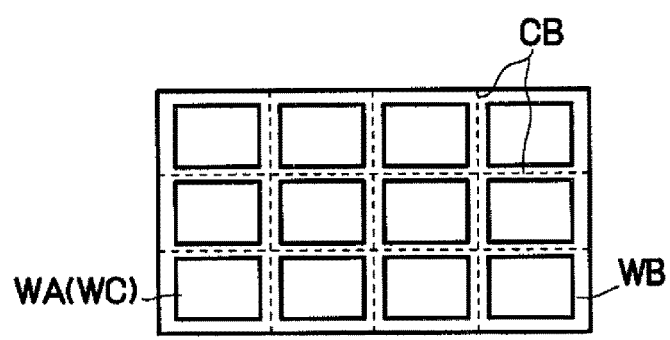

Next, as shown in FIG. 7 (a), copper substrates Wa and Wc which are metal substrates having longitudinal and lateral sizes of slightly smaller than those of the silicon nitride substrate WB, and having a thickness 0.5 mm, were placed on the opposite surfaces of the silicon nitride substrate WB with the brazing material coated on the silicon nitride substrate WB therebetween, and heated in a non-oxidizing atmosphere having a vacuum degree of 1 Pa or less, at 820° C. for 1 hour, and then, cooled by furnace cooling. Thereby, the silicon nitride substrate WB was bonded to the copper substrates Wa and Wb, and a bonded body was obtained. In FIG. 7 (a), the brazing material paste m1 and m3 shown in FIG. 6(d) is shown by dotted lines.

[Etching Step]

The bonded body was subjected to etching treatment. As shown in FIG. 7 (b), spaces S in the planar direction were formed by etching so as to have sizes and shapes corresponding to the copper substrates WA and WC of each circuit boards W shown in FIG. 2(a), and the copper substrates Wa and Wc (copper substrates Wc are not shown) bonded to the silicon nitride substrates WB were separated. Specifically, UV curable etching resist was coated on the surface of the copper substrate Wa to have a predetermined pattern by screen printing, and thereafter, the bonded body was immersed in an etching solution, i.e., ferric chloride (FeCl$_3$) solution (46.5Be) having a liquid temperature of 50° C., and thus, the copper substrates Wa/Wc were separated.

[Brazing Material Removing Step]

After the etching resist was removed, unnecessary brazing material remaining around the copper substrates WA and WC was removed by brazing material remover containing hydrogen peroxide and ammonium acid fluoride.

[Separation Step]

Thereafter, the silicon nitride substrate WB was cut along the dotted lines CB in FIG. 7 (c), and 12 pieces of circuit board W shown in FIG. 2 (a) were obtained per silicon nitride substrate MB.

[Properties of Silicon Nitride Substrate]

Figure 4:
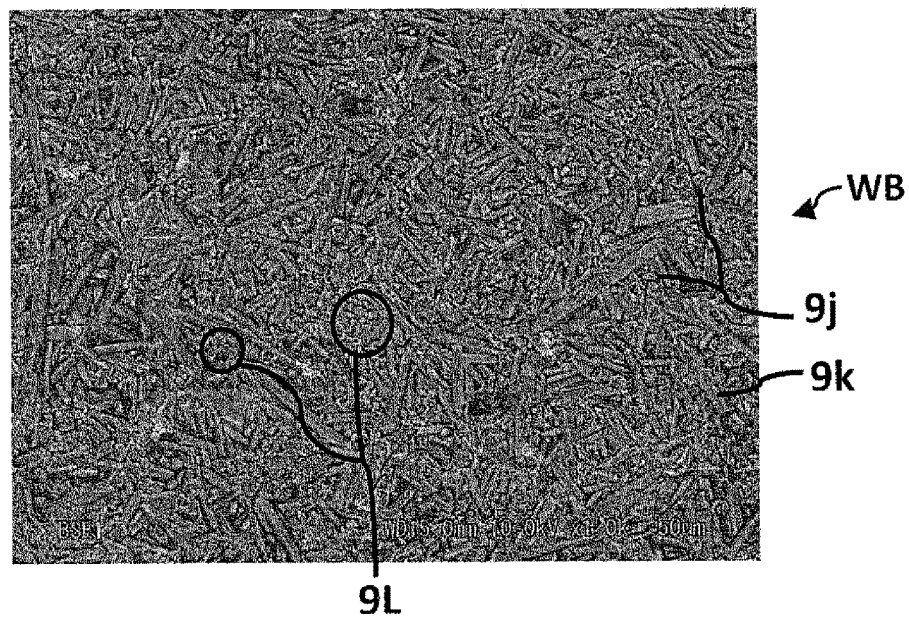
FIG. 4 is a view showing the surface texture of the silicon nitride substrate.

Regarding each of silicon nitride substrates of Examples 1 to 43 and Comparative Examples 1 to 7 formed by the above-mentioned separation layer forming step to sintering step, Table 6 shows density of first silicon nitride particles on the surface and surface layer, density of first silicon nitride particles in the inner layer, maximum diameter of an aggregation part formed by the aggregation of the first silicon nitride particles, density of the aggregation part on the surface and surface layer, and density of aggregation part in the inner layer. As shown in, for example, FIG. 4, these values were measured on the basis of microphotographs of cross sections at any selected parts in the surface layer located at the depth of 20 μm or less from the substrate surface of the silicon nitride substrate WB, and in the inner layer located at the depth other than that of the surface layer from the substrate surface. In FIG. 4, the symbol 9j indicates first silicon nitride particles, the symbol 9k indicates second silicon nitride particles, and symbol 9L indicates an aggregation part formed by the aggregation of the first silicon nitride particles. Here, the first silicon nitride particle 9j is a silicon nitride particle having an aspect ratio obtained by dividing the major axis length by the minor axis length of 3.0 or less, and an major axis length of 5.0 μm or less, and the second silicon nitride particle 9k is a silicon nitride particle having a major axis length and an aspect ratio exceeding those of the first silicon nitride particle 9j.

TABLE 6

| | Constitution of Silicon Nitride Substrate First Silicon Nitride Particle | | | | |
|---|---|---|---|---|---|
| | Density (Surface, Surface Layer) piece/ $10^2$ μm$^2$ | Density (Inner Layer) piece/ $10^2$ μm$^2$ | Aggregation Part Maximum Diameter μm | Aggregation Part Density (Surface, Surface Layer) piece/ $10^4$ μm$^2$ | Aggregation Part Density (Inner Layer) piece/ $10^4$ μm$^2$ |
| Example 1 | 35 | 25 | 18 | 20 | 16 |
| Example 2 | 26 | 20 | 18 | 16 | 15 |
| Example 3 | 20 | 18 | 16 | 13 | 12 |
| Example 4 | 16 | 15 | 14 | 10 | 8 |
| Example 5 | 15 | 13 | 14 | 10 | 9 |
| Example 6 | 13 | 11 | 13 | 9 | 7 |
| Example 7 | 12 | 11 | 13 | 8 | 5 |
| Example 8 | 11 | 10 | 13 | 7 | 4 |
| Example 9 | 20 | 18 | 16 | 13 | 11 |
| Example 10 | 14 | 12 | 13 | 10 | 8 |
| Example 11 | 7 | 5 | 14 | 5 | 2 |
| Example 12 | 5 | 4 | 14 | 5 | 3 |
| Example 13 | 21 | 18 | 16 | 14 | 12 |
| Example 14 | 23 | 20 | 16 | 15 | 13 |
| Example 15 | 24 | 22 | 18 | 16 | 13 |
| Example 16 | 27 | 23 | 18 | 17 | 12 |
| Example 17 | 29 | 20 | 18 | 18 | 11 |
| Example 18 | 30 | 23 | 19 | 18 | 11 |
| Example 19 | 36 | 23 | 20 | 19 | 12 |
| Example 20 | 33 | 23 | 19 | 19 | 13 |
| Example 21 | 32 | 24 | 19 | 18 | 14 |
| Example 22 | 19 | 15 | 14 | 12 | 9 |
| Example 23 | 18 | 14 | 14 | 12 | 10 |

TABLE 6-continued

Constitution of Silicon Nitride Substrate
First Silicon Nitride Particle

| | Density (Surface, Surface Layer) piece/ $10^2$ μm² | Density (Inner Layer) piece/ $10^2$ μm² | Aggregation Part Maximum Diameter μm | Aggregation Part Density (Surface, Surface Layer) piece/ $10^4$ μm² | Aggregation Part Density (Inner Layer) piece/ $10^4$ μm² |
|---|---|---|---|---|---|
| Example 24 | 17 | 14 | 14 | 11 | 9 |
| Example 25 | 35 | 25 | 18 | 18 | 13 |
| Example 26 | 38 | 28 | 21 | 22 | 18 |
| Example 27 | 26 | 20 | 20 | 22 | 16 |
| Example 28 | 20 | 15 | 19 | 20 | 16 |
| Example 29 | 16 | 10 | 19 | 21 | 17 |
| Example 30 | 15 | 10 | 18 | 19 | 15 |
| Example 31 | 13 | 10 | 15 | 18 | 13 |
| Example 32 | 12 | 8 | 14 | 18 | 14 |
| Example 33 | 11 | 4 | 14 | 17 | 13 |
| Example 34 | 11 | 4 | 13 | 7 | 5 |
| Example 35 | 11 | 4 | 13 | 7 | 5 |
| Example 36 | 11 | 4 | 18 | 17 | 15 |
| Example 37 | 11 | 4 | 25 | 25 | 20 |
| Example 38 | 39 | 25 | 20 | 20 | 18 |
| Example 39 | 11 | 4 | 18 | 16 | 14 |
| Example 40 | 38 | 24 | 16 | 13 | 11 |
| Example 41 | 38 | 30 | 20 | 20 | 18 |
| Example 42 | 25 | 15 | 13 | 10 | 10 |
| Example 43 | 30 | 20 | 15 | 18 | 14 |
| Comparative Example 1 | 38 | 23 | 20 | 20 | 15 |
| Comparative Example 2 | 38 | 22 | 20 | 20 | 16 |
| Comparative Example 3 | 45 | 34 | 23 | 27 | 21 |
| Comparative Example 4 | 11 | 6 | 15 | 7 | 5 |
| Comparative Example 5 | 34 | 23 | 17 | 19 | 17 |
| Comparative Example 6 | 36 | 24 | 16 | 20 | 16 |
| Comparative Example 7 | 42 | 31 | 20 | 26 | 21 |

Figure 5:
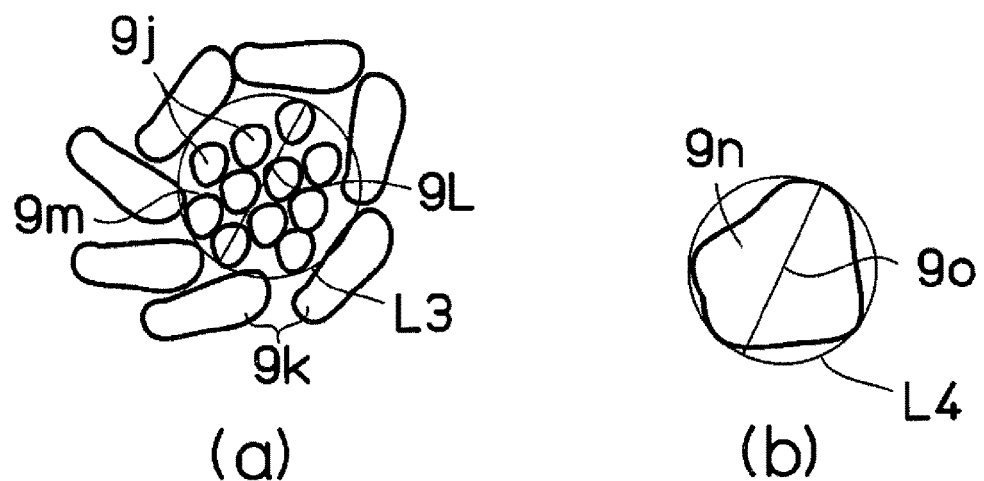
FIG. 5 is a view explaining the definition regarding the maximum diameters of the aggregation part and pore.

The density of the first silicon nitride particles means the number of first silicon nitride particles in a 10 μm square region set at any selected parts on the surface or in the cross section. The density of the aggregation parts means the number of aggregation parts of the first silicon nitride particles in a 100 μm square region set at any selected parts on the surface or in the cross section. Further, the surface layer of the silicon nitride substrate means a portion located at a depth of 20 μm or less from the surface, and the inner layer means the inner portions other than the surface layer. The maximum diameter of the aggregation part 9L means a diameter of the minimum circle L3 including the aggregation part 9L, as shown by the symbol 9m in the schematic view of the aggregation part 9L in FIG. 5(a).

Regarding each of silicon nitride substrates of Examples 1 to 43 and Comparative Examples 1 to 7, Table 7 shows the area ratio of the second silicon nitride particles having an aspect ratio of 5.0 to 20.0 and a major axis length of 6 to 30 μm in the surface layer located at the depth of 20 μm from the substrate surface, the maximum diameter and the density of the pore, and the thickness of the silicon nitride substrate. The area ratio of the second silicon nitride particle having the above-mentioned predetermined aspect ratio and major axis length was obtained as an area ratio in a 10 μm square region in any selected parts in the surface layer. The maximum diameter of the pore means the diameter of the minimum circle L4 including the pore 9n, as shown by the symbol 9o in the schematic view of the pore 9n in FIG. 5(b). The density of the pore means the number of pores within the 10 μm square region set at any selected parts in the surface layer.

TABLE 7

Constitution of Silicon Nitride Substrate

| | Second Silicon Nitride Particle Area Ratio of Predetermined Second Silicon Nitride Particle % | Void Maximum Diameter μm | Void Density piece/ $10^4$ μm² | Thickness mm |
|---|---|---|---|---|
| Example 1 | 16.2 | 8 | 13 | 0.25 |
| Example 2 | 16.3 | 6.0 | 11 | 0.25 |
| Example 3 | 17.2 | 4.5 | 10 | 0.25 |
| Example 4 | 16.2 | 3.4 | 9 | 0.25 |
| Example 5 | 16.3 | 3.4 | 8 | 0.25 |
| Example 6 | 17.1 | 3.2 | 6 | 0.25 |
| Example 7 | 18.1 | 3.1 | 5 | 0.25 |
| Example 8 | 16.9 | 2.8 | 5 | 0.25 |
| Example 9 | 16.4 | 4.5 | 10 | 0.25 |
| Example 10 | 16.5 | 3.2 | 9 | 0.25 |
| Example 11 | 16.3 | 1.8 | 4 | 0.25 |
| Example 12 | 17.2 | 1.4 | 2 | 0.25 |
| Example 13 | 17.2 | 4.5 | 10 | 0.25 |
| Example 14 | 17.0 | 5.6 | 11 | 0.25 |
| Example 15 | 15.2 | 5.8 | 11 | 0.25 |
| Example 16 | 14.2 | 6.1 | 12 | 0.25 |
| Example 17 | 16.1 | 6.2 | 13 | 0.25 |
| Example 18 | 16.2 | 6.3 | 13 | 0.25 |
| Example 19 | 16.3 | 8 | 13 | 0.25 |
| Example 20 | 16.9 | 8 | 13 | 0.25 |
| Example 21 | 16.5 | 6.3 | 13 | 0.25 |
| Example 22 | 16.5 | 3.9 | 10 | 0.25 |
| Example 23 | 16.9 | 3.8 | 10 | 0.25 |
| Example 24 | 16.3 | 3.5 | 9 | 0.25 |
| Example 25 | 16.9 | 8 | 12 | 0.80 |
| Example 26 | 13.1 | 8.7 | 15 | 0.25 |
| Example 27 | 12.1 | 8.5 | 14 | 0.25 |
| Example 28 | 13.5 | 8.3 | 15 | 0.25 |
| Example 29 | 12.5 | 7.9 | 16 | 0.25 |
| Example 30 | 13.4 | 8.1 | 12 | 0.25 |
| Example 31 | 12.8 | 8.1 | 11 | 0.25 |
| Example 32 | 13.6 | 4.3 | 13 | 0.25 |
| Example 33 | 12.4 | 4.2 | 11 | 0.25 |
| Example 34 | 29.5 | 2.8 | 5 | 0.25 |
| Example 35 | 22.1 | 2.8 | 5 | 0.25 |
| Example 36 | 4.8 | 9.6 | 19 | 0.25 |
| Example 37 | 2 | 9.8 | 20 | 0.25 |
| Example 38 | 15.2 | 8 | 13 | 0.20 |
| Example 39 | 14.3 | 7.6 | 12 | 0.25 |
| Example 40 | 15.1 | 7.2 | 14 | 0.25 |
| Example 41 | 16.2 | 8 | 15 | 0.25 |
| Example 42 | 16.3 | 6 | 10 | 0.25 |
| Example 43 | 16.3 | 7 | 11 | 0.25 |
| Comparative Example 1 | 16.2 | 8 | 15 | 1.0 |
| Comparative Example 2 | 16.2 | 8 | 15 | 0.18 |
| Comparative Example 3 | 16.2 | 10 | 18 | 0.25 |
| Comparative Example 4 | 17.2 | 2.8 | 5 | 0.25 |
| Comparative Example 5 | 16.2 | 7 | 12 | 0.25 |
| Comparative Example 6 | 16.2 | 8 | 11 | 0.25 |
| Comparative Example 7 | 15.1 | 7.2 | 14 | 0.25 |

Regarding each of silicon nitride substrates of Examples 1 to 43 and Comparative Examples 1 to 7, Table 8 shows the surface waviness, the value of the ratio (B/Si) between fluorescent X-ray intensities of boron (B) and silicon (Si), the value of the ratio (C/Si) between fluorescent X-ray intensities of carbon (C) and silicon (Si), and the ratio B/C of these values, at any selected parts on the surface, and the coefficient of variation boron (B) on the substrate surface measured by an electron probe micro analyzer (EPMA). The fluorescent X-ray intensities of boron (B) and carbon (C) were represented as the ratio relative to the fluorescent X-ray intensity of silicon (Si), taking the machine difference of the fluorescent X-ray intensity measuring devices into account.

TABLE 8

| | Constitution of Silicon Nitride Substrate | | | |
|---|---|---|---|---|
| | Surface Waviness μm | B/Si (×10$^{-5}$) | C/Si (×10$^{-5}$) | B/C | Coefficient of Variation of B |
| Example 1 | 0.98 | 240 | 86 | 2.8 | 0.9 |
| Example 2 | 0.53 | 230 | 267 | 0.86 | 1 |
| Example 3 | 0.46 | 230 | 277 | 0.83 | 0.8 |
| Example 4 | 0.41 | 200 | 278 | 0.72 | 0.8 |
| Example 5 | 0.38 | 230 | 348 | 0.66 | 0.7 |
| Example 6 | 0.35 | 210 | 362 | 0.58 | 0.8 |
| Example 7 | 0.35 | 160 | 320 | 0.5 | 0.8 |
| Example 8 | 0.41 | 200 | 2273 | 0.088 | 1.2 |
| Example 9 | 0.46 | 7 | 3 | 2.6 | 0.8 |
| Example 10 | 0.37 | 7.4 | 9 | 0.82 | 0.9 |
| Example 11 | 0.28 | 8 | 16 | 0.51 | 0.8 |
| Example 12 | 0.25 | 7.1 | 75 | 0.095 | 0.7 |
| Example 13 | 0.47 | 8.2 | 3 | 2.4 | 0.9 |
| Example 14 | 0.48 | 10 | 5 | 2.2 | 0.8 |
| Example 15 | 0.5 | 12 | 5 | 2.2 | 0.8 |
| Example 16 | 0.55 | 82 | 46 | 1.8 | 0.7 |
| Example 17 | 0.57 | 110 | 58 | 1.9 | 1 |
| Example 18 | 0.59 | 150 | 68 | 2.2 | 0.8 |
| Example 19 | 0.8 | 230 | 82 | 2.8 | 0.5 |
| Example 20 | 0.72 | 240 | 120 | 2 | 0.4 |
| Example 21 | 0.63 | 230 | 105 | 2.2 | 0.3 |
| Example 22 | 0.45 | 8.2 | 5 | 1.8 | 0.5 |
| Example 23 | 0.44 | 8.4 | 7 | 1.2 | 0.4 |
| Example 24 | 0.42 | 7.8 | 7 | 1.2 | 0.3 |
| Example 25 | 1 | 250 | 89 | 2.8 | 0.8 |
| Example 26 | 0.98 | 250 | 89 | 2.8 | 0.7 |
| Example 27 | 0.53 | 240 | 282 | 0.85 | 0.8 |
| Example 28 | 0.46 | 240 | 289 | 0.83 | 0.8 |
| Example 29 | 0.41 | 210 | 284 | 0.74 | 0.8 |
| Example 30 | 0.38 | 230 | 319 | 0.72 | 0.9 |
| Example 31 | 0.35 | 220 | 400 | 0.55 | 0.8 |
| Example 32 | 0.35 | 180 | 400 | 0.45 | 0.8 |
| Example 33 | 0.34 | 190 | 2111 | 0.09 | 0.7 |
| Example 34 | 0.34 | 180 | 2250 | 0.08 | 0.7 |
| Example 35 | 0.34 | 190 | 2111 | 0.09 | 0.8 |
| Example 36 | 0.34 | 220 | 2200 | 0.1 | 0.7 |
| Example 37 | 0.34 | 240 | 2000 | 0.12 | 0.8 |
| Example 38 | 0.9 | 230 | 79 | 2.9 | 0.8 |
| Example 39 | 0.34 | 200 | 2222 | 0.09 | 0.8 |
| Example 40 | 0.46 | 220 | 79 | 2.8 | 0.8 |
| Example 41 | 0.98 | 240 | 86 | 2.8 | 0.9 |
| Example 42 | 0.76 | 240 | 120 | 2 | 0.8 |
| Example 43 | 0.88 | 250 | 140 | 1.8 | 0.9 |
| Comparative Example 1 | 0.42 | 240 | 4800 | 0.05 | 0.9 |

TABLE 8-continued

| | Constitution of Silicon Nitride Substrate | | | |
|---|---|---|---|---|
| | Surface Waviness μm | B/Si (×10$^{-5}$) | C/Si (×10$^{-5}$) | B/C | Coefficient of Variation of B |
| Comparative Example 2 | 1.5 | 240 | 86 | 2.8 | 0.9 |
| Comparative Example 3 | 1.3 | 240 | 73 | 3.3 | 0.9 |
| Comparative Example 4 | 0.34 | 240 | 3429 | 0.07 | 0.9 |
| Comparative Example 5 | 0.95 | 6 | 2 | 2.8 | 0.8 |
| Comparative Example 6 | 1.25 | 260 | 96 | 2.7 | 0.9 |
| Comparative Example 7 | 1.15 | 220 | 72 | 3.1 | 0.8 |

The coefficient of variation of boron (B) obtained by the electron probe micro analyzer is a value obtained by scanning a range of 1 mm at a beam diameter of 1 μm, measuring fluorescent X-ray intensities of boron (B) at an interval of 2 μm, and calculating by dividing the standard deviation of the measured values by the average value thereof. The surface waviness refers to an arithmetic average waviness Wa obtained by measuring a filtered centerline waviness using a surface roughness meter, namely, an arithmetic average of absolute values of deviation from the average value with respect to the surface height. The measurement conditions include an evaluation length of 30 mm, a measurement velocity of 0.3 mm/s, a cut-off value (λc) of 0.25 mm, and a cut-off value (λf) of 8.0 mm. In Example 25 and Comparative Examples 1 and 2, in order to obtain silicon nitride substrates having thicknesses of 0.8, 1.0, and 0.18 mm, respectively, green sheets having thicknesses of 1.0, 1.25, and 0.23 mm were used, respectively.

Regarding each of silicon nitride substrates of Examples 1 to 43 and Comparative Examples 1 to 7, Table 9 shows a separation property, a bending strength, and a thermal conductivity. The numerical value described in the field of separation property of silicon nitride substrate is a pass rate that the silicon nitride substrates were normally removed without being broken, from 10 groups of silicon nitride substrates each group having 20 stacked sintered substrates, i.e., 200 silicon nitride substrates. The bending strength is compliant with JIS R1601, and obtained by processing the obtained silicon nitride substrate to the width of 4 mm, setting the processed substrate in a three-point bending jig with a 7 mm distance between support rolls, applying weights at a crosshead velocity of 0.5 mm/minute, and calculating from the weight applied when the substrate was broken. The thermal conductivity was obtained by processing the above-mentioned silicon nitride substrate into a 5 mm square, blackening the front and rear surfaces by carbon spray, and applying a laser flash method compliant with JIS R1611.

TABLE 9

| | Properties of Silicon Nitride Substrate | | | Properties of Circuit Board | | |
|---|---|---|---|---|---|---|
| | Separation Property % | Bending Strength MPa | Thermal Conductivity W/m · k | Results of Peel Strength Test % | Results of Thermal Cycling Test % | Results of Insulation Test % |
| Example 1 | 100 | 761 | 83 | 95 | 96 | 90 |
| Example 2 | 100 | 758 | 82 | 93 | 94 | 97 |

TABLE 9-continued

|  | Properties of Silicon Nitride Substrate | | | Properties of Circuit Board | | |
| --- | --- | --- | --- | --- | --- | --- |
|  | Separation Property % | Bending Strength MPa | Thermal Conductivity W/m·k | Results of Peel Strength Test % | Results of Thermal Cycling Test % | Results of Insulation Test % |
| Example 3 | 100 | 755 | 80 | 93 | 94 | 99 |
| Example 4 | 100 | 772 | 84 | 93 | 94 | 99 |
| Example 5 | 100 | 769 | 83 | 93 | 94 | 100 |
| Example 6 | 100 | 767 | 82 | 93 | 94 | 100 |
| Example 7 | 100 | 761 | 83 | 93 | 94 | 100 |
| Example 8 | 99 | 738 | 82 | 93 | 94 | 100 |
| Example 9 | 93 | 755 | 98 | 100 | 100 | 99 |
| Example 10 | 95 | 748 | 97 | 100 | 100 | 100 |
| Example 11 | 97 | 749 | 96 | 100 | 100 | 100 |
| Example 12 | 96 | 699 | 96 | 100 | 99 | 100 |
| Example 13 | 94 | 764 | 96 | 99 | 99 | 98 |
| Example 14 | 95 | 745 | 94 | 98 | 98 | 98 |
| Example 15 | 96 | 750 | 91 | 97 | 96 | 97 |
| Example 16 | 97 | 742 | 87 | 96 | 96 | 96 |
| Example 17 | 98 | 762 | 86 | 95 | 95 | 95 |
| Example 18 | 99 | 755 | 85 | 94 | 95 | 95 |
| Example 19 | 100 | 752 | 83 | 93 | 94 | 94 |
| Example 20 | 100 | 753 | 80 | 93 | 94 | 94 |
| Example 21 | 100 | 751 | 84 | 93 | 94 | 95 |
| Example 22 | 93 | 748 | 98 | 100 | 100 | 99 |
| Example 23 | 93 | 747 | 95 | 100 | 100 | 99 |
| Example 24 | 93 | 761 | 96 | 100 | 100 | 99 |
| Example 25 | 100 | 748 | 97 | 100 | 100 | 90 |
| Example 26 | 100 | 735 | 80 | 95 | 90 | 90 |
| Example 27 | 100 | 742 | 81 | 95 | 91 | 92 |
| Example 28 | 100 | 736 | 80 | 94 | 91 | 92 |
| Example 29 | 100 | 748 | 82 | 94 | 94 | 95 |
| Example 30 | 100 | 747 | 84 | 93 | 96 | 96 |
| Example 31 | 100 | 752 | 85 | 94 | 98 | 97 |
| Example 32 | 100 | 758 | 84 | 93 | 98 | 100 |
| Example 33 | 100 | 742 | 85 | 93 | 97 | 100 |
| Example 34 | 100 | 620 | 82 | 93 | 94 | 100 |
| Example 35 | 100 | 718 | 80 | 93 | 94 | 100 |
| Example 36 | 100 | 674 | 83 | 96 | 94 | 91 |
| Example 37 | 100 | 605 | 80 | 95 | 93 | 90 |
| Example 38 | 100 | 752 | 82 | 90 | 90 | 91 |
| Example 39 | 100 | 747 | 82 | 90 | 90 | 90 |
| Example 40 | 100 | 720 | 83 | 90 | 90 | 92 |
| Example 41 | 100 | 761 | 83 | 95 | 96 | 90 |
| Example 42 | 100 | 754 | 82 | 91 | 96 | 94 |
| Example 43 | 100 | 742 | 80 | 90 | 95 | 92 |
| Comparative Example 1 | 93 | 761 | 96 | 100 | 100 | 100 |
| Comparative Example 2 | 100 | 761 | 58 | 72 | 82 | 82 |
| Comparative Example 3 | 99 | 761 | 82 | 86 | 93 | 72 |
| Comparative Example 4 | 100 | 501 | 50 | 52 | 65 | 87 |
| Comparative Example 5 | 65 | 761 | 57 | 75 | 78 | 84 |
| Comparative Example 6 | 100 | 761 | 83 | 52 | 94 | 76 |
| Comparative Example 7 | 100 | 732 | 84 | 88 | 91 | 85 |

[Properties of Circuit Board]

Regarding each of circuit boards of Examples 1 to 43 and Comparative Examples 1 to 7 formed through the metal substrate bonding step to the separation step, Table 9 shows the result of a peel strength test, a heating/cooling cycle test, and an insulation test. The numerical value described in the field of the peel strength test result is a pass rate when 100 test pieces explained below were subjected to the peel strength test. The numerical values described in the field of the heating/cooling cycle test result and the insulation test result are pass rates when 100 circuit boards were subjected to these tests.

Figure 3:
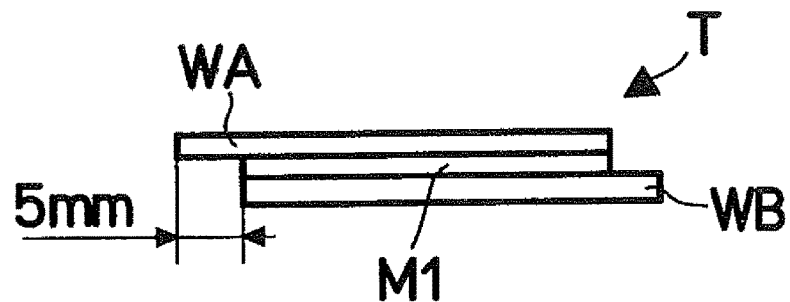
FIG. 3 is a side view showing a schematic structure of a test piece used in a peel test.

In the peel strength test, as shown in FIG. 3, a test piece T was prepared by arranging the copper substrate WA so that one end of the copper substrate WA projects relative to the side face of the silicon nitride substrate WB, and performing bonding under the same bonding conditions as the circuit board. The force per unit length required for raising the projected portion in 90 degrees upward was evaluated, and a test piece requiring the force of 20 kN/m or more is treated as passing the test. In the heating/cooling cycle test, a temperature rising/temperature lowering cycle was repeated for 3000 times to apply thermal stress to the circuit board, each cycle including cooling at −40° C. for 20 minutes, temperature holding at a room temperature for 10 minutes, and heating at 125° C. for 20 minutes. If no cracks were generated in the silicon nitride substrate, the substrate was treated as passing the test. In the insulation test, when a voltage of 5 kV was applied to the circuit board for 1 minute, if no cracks were generated in the silicon nitride substrate, the substrate was treated as passing the test.

The following findings were obtained from Examples 1 to 43 shown in Tables 1 to 9. It was confirmed that a silicon nitride substrate can have the surface waviness of 1.00 μm or less, when the silicon nitride substrate was obtained by the production method according to the present invention, to have a thickness t of 0.20 to 0.80 mm; contain 40 or less first silicon nitride particles present within a 10 μm square region set on any selected parts on the substrate surface, the first silicon nitride particle having an aspect ratio obtained by dividing a major axis length by a minor axis length of 3.0 or less and having a major axis length of 5.0 μm or less; have a ratio (B/Si) between fluorescent X-ray intensities of boron (B) and silicon (Si) on any selected parts on the substrate surface, in range of $7.0 \times 10^{-5}$ to $250 \times 10^{-5}$; and have a ratio B/C of 0.080 to 3.000 when the ratio between fluorescent X-ray intensities of carbon (C) and silicon (Si) is C/Si. All of such silicon nitride substrates had a separation property of 90% or more. The result of the peel test using the test piece of these silicon nitride substrates revealed a high pass rate of 90% or more. When the silicon nitride substrate has a thickness of 0.8 mm (Example 25), and when the separation layer was formed by spray coating (Example 41), the same results were obtained.

A silicon nitride substrate had a bending strength exceeding 600 (MPa), when the silicon nitride substrate contains 40 or less first silicon nitride particles within a 10 μm square region set in any selected parts in the surface layer located at the depth of 20 μm or less from the substrate surface, and contains 30 or less first silicon nitride particles within a 10 μm square region set in any selected parts in the inner layer located at the depth other than the depth of the surface layer from the surface. The result of the thermal resistance cycling test of circuit boards using such silicon nitride substrates revealed a high pass rate of 90% or more.

A silicon nitride substrate had a bending strength of 600 (MPa) or more and a thermal conductivity of 80 (W/m·k) or more, when the silicon nitride substrate contained second silicon nitride particles within a 10 μm square region set in any selected parts in the surface layer located at the depth of 20 μm or less from the substrate surface, at the area ratio of 1.0 to 30.0%, the second silicon nitride particle having an aspect ratio of 5.0 to 20.0, and a major axis length of 6.0 to 30.0 μm. The results of the thermal resistance cycling test and the insulation resistance test of circuit boards using such silicon nitride substrates revealed high pass rates of 90% or more, respectively.

When a silicon nitride substrate contained an aggregation part formed by the aggregation of the first silicon nitride particles to have a maximum diameter of 25 μm or less, on the substrate surface or in the surface layer located at the depth of 20 μm or less from the substrate surface, such a silicon nitride substrate had a bending strength exceeding 600 (MPa). The result of the thermal resistance cycling test of circuit boards using such silicon nitride substrates revealed a high pass rate of 90% or more. In particular, when the area ratio of the second silicon nitride particle was 4 to 23%, and the aggregation part had a maximum diameter of 20 μm or less (other than Example 37), this effect was remarkable.

When a silicon nitride substrate contained 25 or less aggregation parts in a 100 μm square region set in any selected parts on the substrate surface or in the surface layer located at the depth of 20 μm or less from the substrate surface, such a silicon nitride substrate had a thermal conductivity exceeding 80 (w/m·k). The result of the thermal resistance cycling test of circuit boards using such silicon nitride substrates revealed a high pass rate of 90% or more. In particular, when the area ratio of the second silicon nitride particle was 4 to 23%, and the aggregation part had a maximum diameter of 20 μm or less, this effect was remarkable.

When a silicon nitride substrate contained 25 or less aggregation parts within a 100 μm square region set in any selected parts in the surface layer located at the depth of 20 μm or less from the substrate surface, and contained 20 or less aggregation parts within a 100 μm square region set in any selected parts in the inner layer located at the depth other than the depth of the surface layer from the surface, such a silicon nitride substrate had a bending strength of 600 (MPa) or more and a thermal conductivity of 80 (W/m·k) or more. The result of the thermal resistance cycling test of circuit boards using such silicon nitride substrates revealed a high pass rate of 90% or more. In particular, when the area ratio of the second silicon nitride particle was 4 to 23%, and the aggregation part had a maximum diameter of 20 μm or less, this effect was remarkable.

When a silicon nitride substrate contained a pore having a maximum diameter of 10 μm or less and formed in the intergranular phase around the first silicon nitride particle, on the substrate surface or in the surface layer located at the depth of 20 μm or less from the substrate surface, and preferably contained 20 or less pores within a 100 μm square region set in any selected parts on the substrate surface or in the surface layer located at the depth of 20 μm or less from the substrate surface, such a silicon nitride substrate had a bending strength of 600 (MPa) or more and a thermal conductivity of 80 (W/m·k) or more. The results of the thermal resistance cycling test and the insulation resistance test of circuit boards using such silicon nitride substrates revealed high pass rates of 90% or more, respectively. In particular, when the area ratio of the second silicon nitride particle was 4 to 23%, and the aggregation part had a maximum diameter of 20 μm or less, this effect was remarkable.

It was also confirmed that when a silicon nitride substrate had a coefficient of variation of 1.0 or less regarding the characteristic X-ray intensity of boron (B) on the substrate surface, measured by an electron probe micro analyzer (EPMA), such a silicon nitride substrate had a small surface waviness, which might be 0.5 or less.

On the other hand, according to Comparative Example 1 wherein a silicon nitride substrate had a large thickness of 1.0 mm, even if the B/C was as low as 0.05, namely, the remaining carbon content was small, the surface waviness was small. Therefore, it was confirmed that the present invention is not effective for a silicon nitride substrate having a large thickness.

According to Comparative Example 2 wherein a silicon nitride substrate had a small thickness of 0.18 mm, the surface waviness was not improved. Therefore, it was confirmed that the present invention is not effective for such a silicon nitride substrate.

According to Comparative Example 3, wherein the ratio c/a between the oxygen content (c) in the BN powder of the BN paste, and the carbon content (a) in the BN layer, was 13 which exceeded the upper limit, the value of B/C was 3.3 which exceeded the upper limit. When Comparative Example 3 was compared to Examples 1 to 8 which had substantially the same conditions except for B/C, it was confirmed that the surface waviness of the silicon nitride substrate was not improved in Comparative Example 3. On the other hand, according to Comparative Example 4 having c/a of 0.01 which was lower than the lower limit, the B/C was 0.07. When Comparative Example 4 was compared to Examples 1 to 8 which had substantially the same conditions except for B/C, it was confirmed that the surface waviness of the silicon nitride substrate was improved in Comparative Example 4, but the bending strength and the thermal conductivity were extremely low, and the pass rate of the thermal resistance cycling test was lower.

According to Comparative Example 5 wherein the BN powder content in the BN layer was 0.15 mg/cm$^2$, which was lower than the lower limit, the B/Si was 6 which was lower than the lower limit. When Comparative Example 5 was compared to Examples 1, 10, and 13 to 18, which had substantially the same conditions except for B/Si, it was confirmed that the silicon nitride substrate had an extremely low separation property because the amount of BN powder contained in the separation layer was small. On the other hand, according to Comparative Example 6 wherein the BN powder content in the BN layer was 3.7 mg/cm$^2$ which was higher than the upper limit, the B/Si was 260 which was higher than the upper limit. When Comparative Example 6 was compared to Examples 1, 10, and 13 to 18, which had substantially the same conditions except for B/Si, the waviness of the silicon nitride substrate was larger, and the result of the peel strength test became inferior because the bonding property to the copper substrates were disturbed by the BN powder remaining on the surface of the silicon nitride substrate. In addition, according to Comparative Example 7 wherein the difference a–b was 0, (b) representing the carbon content (b) in the BN powder of the BN paste, and (a) representing the carbon content contained in the BN layer after the degreasing step, namely, the organic binder was substantially completely removed in the degreasing step, the c/a was 13.3 which was higher than the upper limit. As a result, it was confirmed that the surface waviness of the silicon nitride substrate was not improved.

Next, the results obtained by changing the mixing time of the BN paste will be explained with reference to Examples 44 to 47. Example 44 corresponds to Example 9, Example 45 corresponds to Example 6, Example 46 corresponds to Example 7, and Example 47 corresponds to Example 8, respectively. As shown in Tables 10 and 11, the silicon nitride substrates and the circuit boards were produced under production conditions in which, basically, only the mixing time was changed. The properties of the silicon nitride substrates and the properties of the circuit boards were confirmed in the same way as those in Examples 1 to 43.

TABLE 10

| | Constitution of Boron Nitride Paste | | | | | | |
|---|---|---|---|---|---|---|---|
| | Oxygen Content (c) in Boron Nitride Powder % by mass | Carbon Content (b) in Boron Nitride Powder % by mass | Organic Binder: Composition part by mass | Organic Solvent: Composition part by mass | Mixing Time Hour | Properties of Boron Nitride Paste | |
| | | | | | | Viscosity cP | Thixotropy — |
| Example 44 | 0.4 | 0.03 | 8.75 | 750 | 0.2 | 3000 | 1.1 |
| Example 45 | 0.5 | 0.1 | 26 | 85 | 1 | 36000 | 2.1 |
| Example 46 | 0.4 | 0.03 | 35 | 85 | 5 | 35000 | 2.1 |
| Example 47 | 0.3 | 0.03 | 44 | 80 | 10 | 34000 | 2 |

TABLE 11

| | Degreasing Step | | | | | Constitution of Separation Layer | | | |
|---|---|---|---|---|---|---|---|---|---|
| | Degreasing Temperature (A6) °C. | Remaining Carbon (a) % by mass | a – b % by mass | c/a — | A6 – A1 °C. | Thickness μm | Content of Boron Nitride Powder mg/cm$^2$ | Intensity Ratio of B/Si by EPMA | |
| | | | | | | | | 0.2 mm Section Average (g) — | 10.0 mm Section Average (f) — |
| Example 44 | 450 | 0.06 | 0.03 | 6.67 | 20 | 4 | 0.3 | 0.165 | 0.13 | 1.3 |
| Example 45 | 500 | 6.1 | 6 | 0.08 | 70 | 4 | 0.9 | 0.198 | 0.16 | 1.2 |
| Example 46 | 600 | 7.7 | 7.67 | 0.05 | 170 | 4 | 0.9 | 0.194 | 0.16 | 1.2 |
| Example 47 | 600 | 14 | 13.97 | 0.02 | 170 | 4 | 1.1 | 0.185 | 0.15 | 1.2 |

According to Examples 44 to 47, by setting the mixing time to be appropriate (0.2 to 10 hours), the BN paste had a viscosity and thixotropy within a more appropriate range, compared to corresponding Examples, as shown in Table 10 (Example 9 had a viscosity of 1000 cP and a thixotropy of 1.02, whereas Example 44 had a viscosity 3000 cP and a thixotropy of 1.1; Example 6 had a viscosity of 47000 cP and a thixotropy of 3, whereas Example 45 had a viscosity of 36000 cP and a thixotropy of 2.1; Example 7 had a viscosity of 48000 cP and a thixotropy of 3.2, whereas Example 46 had a viscosity of 35000 cP and a thixotropy of 2.1; and Example 8 had a viscosity 50000 cP and a thixotropy of 4, whereas Example 47 had a viscosity 34000 cP and a thixotropy of).

As mentioned above, by optimizing the thixotropy and the viscosity, when the BN paste was coated and printed on the surface of the green sheet to form a separation layer, the waviness of the separation layer could be reduced, and as a result, the waviness of the silicon nitride substrate could be also reduced. As shown in Table 14, Example 44 had a waviness of 0.40 μm, Example 45 had a waviness of 0.32 μm, Example 46 had a waviness of 0.32 μm, and Example 47 had a waviness of 0.35 μm, all of which were smaller compared to the respective waviness of the corresponding Examples 9 and 6 to 8.

As shown in Table 12 to Table 15, with respect to the properties other than waviness of the silicon nitride substrate the BN paste, the separation layer, and the silicon nitride substrate satisfied the required ranges.

TABLE 12

| | Constitution of Silicon Nitride Substrate First Silicon Nitride Particle | | | | |
|---|---|---|---|---|---|
| | Density (Surface, Surface Layer) piece/ $10^2$ μm$^2$ | Density (Inner Layer) piece/ $10^2$ μm$^2$ | Aggregation Part Maximum Diameter μm | Aggregation Part Density (Surface, Surface Layer) piece/ $10^4$ μm$^2$ | Aggregation Part Density (Inner Layer) piece/ $10^4$ μm$^2$ |
| Example 44 | 18 | 15 | 15 | 11 | 10 |
| Example 45 | 12 | 10 | 13 | 8 | 7 |
| Example 46 | 11 | 10 | 13 | 7 | 5 |
| Example 47 | 9 | 9 | 12 | 6 | 3 |

TABLE 13

| | Constitution of Silicon Nitride Substrate | | | |
|---|---|---|---|---|
| | Second Silicon Nitride Particle Area Ratio of Predetermined Second Silicon Nitride Particle % | Void Maximum Diameter μm | Density piece/ $10^4$ μm$^2$ | Thickness mm |
| Example 44 | 17 | 3.8 | 9 | 0.25 |
| Example 45 | 17.5 | 3 | 5 | 0.25 |
| Example 46 | 18.8 | 2.9 | 4 | 0.25 |
| Example 47 | 17.3 | 2.7 | 4 | 0.25 |

TABLE 14

| | Constitution of Silicon Nitride Substrate | | | | |
|---|---|---|---|---|---|
| | Surface Waviness μm | B/Si (×10$^{-5}$) | C/Si (×10$^{-5}$) | B/C | Coeffecient of Variation of B |
| Example 44 | 0.4 | 7.2 | 3 | 2.25 | 0.7 |
| Example 45 | 0.32 | 200 | 370 | 0.54 | 0.7 |
| Example 46 | 0.32 | 140 | 332 | 0.42 | 0.6 |
| Example 47 | 0.35 | 190.0 | 2387 | 0.08 | 1 |

TABLE 15

| | Properties of Silicon Nitride Substrate | | | Properties of Circuit Board | | |
|---|---|---|---|---|---|---|
| | Separation Property % | Bending Strength MPa | Thermal Conductivity W/m·k | Results of Peel Strength Test % | Results of Thermal Cycle Test % | Results of Insulation Test % |
| Example 44 | 95 | 765 | 97 | 100 | 100 | 100 |
| Example 45 | 100 | 777 | 85 | 94 | 95 | 100 |
| Example 46 | 100 | 772 | 84 | 94 | 95 | 100 |
| Example 47 | 100 | 748 | 84 | 95 | 96 | 100 |

EXPLANATION ON NUMERALS

1 . . . separation layer, 9j . . . first silicon nitride particle, 9k . . . second silicon nitride particle, 9L . . . aggregation part, Wb . . . molded body (green sheet), WB . . . silicon nitride substrate, W . . . circuit board

The invention claimed is:

1. A silicon nitride substrate which is a sintered body comprising a main phase comprised of silicon nitride particles, and an intergranular phase comprised of a sintering aid, wherein
the main phase contains, on the substrate surface, first silicon nitride particles having an aspect ratio obtained by dividing a major axis length by a minor axis length of 3.0 or less, and having a major axis length of 5.0 μm or less, and second silicon nitride particles having a major axis length and an aspect ratio both exceeding those of the first silicon nitride particles,
40 or less first silicon nitride particles are present within a 10 μm square region set on any selected parts on the substrate surface,
a ratio (B/Si) between fluorescent X-ray intensities of boron (B) and silicon (Si) on any selected parts on the substrate surface is in range of $7.0 \times 10^{-5}$ to $250 \times 10^{-5}$,
the ratio B/C between boron (B) and carbon (C) is 0.080 to 3.000,
the surface waviness is 1.00 μm or less, the surface waviness being an arithmetic average waviness Wa, which is an arithmetic average of absolute values of deviation from an average value of a surface height, obtained by measuring a filtered centerline waviness using a surface roughness meter, and
the thickness t is 0.20 to 0.80 mm,
with the proviso that, for the substrate surface waviness, the measurement conditions include an evaluation length of 30 mm, a measurement velocity of 0.3 mm/s, a cut-off value (λc) of 0.25 mm, and a cut-off value (λf) of 8.0 mm.

2. silicon nitride substrate according to claim 1, wherein the silicon nitride substrate contains 40 or less first silicon nitride particles within a 10 μm square region set in any selected parts in the surface layer located at the depth of 20 μm or less from the substrate surface, and contains 30 or less first silicon nitride particles within a 10 μm square region set in any selected parts in the inner layer located at the depth other than the depth of the surface layer from the surface.

3. A silicon nitride substrate according to claim 1, wherein the silicon nitride substrate has a coefficient of variation of 1.0 or less regarding the characteristic X-ray intensity of boron (B) on the substrate surface, measured by an electron probe micro analyzer (EPMA) under the measurement conditions including scanning a range of 1 mm at a beam diameter of 1 μm, and measuring fluorescent X-ray intensities of boron (B) at an interval of 2 μm, and the value of coefficient of variation is obtained by dividing the standard deviation of the measured values by the average value thereof.

4. A silicon nitride substrate according to claim 1, wherein the silicon nitride substrate contains second silicon nitride particles within a 10 μm square region set in any selected parts in the surface layer located at the depth of 20 μm or less from the substrate surface, at the area ratio of 1.0 to 30.0%, the second silicon nitride particle having an aspect ratio of 5.0 to 20.0, and a major axis length of 6.0 to 30.0 μm.

5. A silicon nitride substrate according to claim 4, wherein the silicon nitride substrate contains a pore having a maximum diameter of 10 μm or less and formed in the intergranular phase around the first silicon nitride particle, in the surface layer located at the depth of 20 μm or less from the substrate surface.

6. A silicon nitride substrate according to claim 5, wherein the silicon nitride substrate contains 20 or less pores within a 100 μm square region set in any selected parts in the surface layer located at the depth of 20 μm or less from the substrate surface.

7. A silicon nitride substrate according to claim 4, wherein the silicon nitride substrate contains an aggregation part formed by aggregation of the first silicon nitride particles and having a maximum diameter of 25 μm or less, in a surface layer located at a depth of 20 μm or less from the substrate surface.

8. A silicon nitride substrate according to claim 7, wherein the silicon nitride substrate contains 25 or less aggregation parts within a 100 μm square region set in any selected parts in the surface layer located at the depth of 20 μm or less from the substrate surface.

9. A silicon nitride substrate according to claim 8, wherein the silicon nitride substrate contains 25 or less aggregation parts within a 100 μm square region set in any selected parts in the surface layer located at the depth of 20 μm or less from the substrate surface, and contains 20 or less aggregation parts within a 100 μm square region set in any selected parts in the inner layer located at the depth other than the depth of the surface layer from the surface.

* * * * *